(12) United States Patent
Iben et al.

(10) Patent No.: US 9,685,201 B2
(45) Date of Patent: Jun. 20, 2017

(54) CORROSION AND/OR OXIDATION DAMAGE PROTECTION FOR TUNNEL JUNCTIONS

(71) Applicant: International Business Machines Corporation, Armonk, NY (US)

(72) Inventors: Icko E. T. Iben, Santa Clara, CA (US); Lee C. Randall, Tucson, AZ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/797,043

(22) Filed: Jul. 10, 2015

(65) Prior Publication Data
US 2017/0011777 A1    Jan. 12, 2017

(51) Int. Cl.
*G11B 33/14*    (2006.01)
(52) U.S. Cl.
CPC .................. *G11B 33/1406* (2013.01)
(58) Field of Classification Search
CPC .............................. G11B 33/14; G11B 33/1406
USPC ............................................. 360/97.11–97.14
See application file for complete search history.

(56) References Cited

U.S. PATENT DOCUMENTS

| | | | |
|---|---|---|---|
| 6,643,093 B2 | 11/2003 | Brown et al. | |
| 6,975,472 B2* | 12/2005 | Stover | G11B 5/02 360/128 |
| 7,534,626 B2 | 5/2009 | Parkin | |
| 7,551,385 B2* | 6/2009 | Biskeborn | G11B 5/40 360/128 |
| 7,589,928 B2* | 9/2009 | Roy | G11B 5/1278 360/69 |
| 7,656,602 B2* | 2/2010 | Iben | G11B 5/3106 360/66 |
| 7,897,412 B2 | 3/2011 | Park et al. | |
| 7,897,950 B2 | 3/2011 | Shoji | |

(Continued)

FOREIGN PATENT DOCUMENTS

| | | |
|---|---|---|
| CN | 100359566 C | 1/2008 |
| CN | 201884065 U | 6/2011 |

OTHER PUBLICATIONS

Georgia State University, "Relative Humidity," Webpage: http://hyperphysics.phy-astr.gsu.edu/hbase/kinetic/relhum.html, Jun. 2015, pp. 1-6.

(Continued)

*Primary Examiner* — Allen T Cao
(74) *Attorney, Agent, or Firm* — Zilka-Kotab, P.C.

(57) ABSTRACT

A system according to one embodiment includes a magnetic structure having a tunnel junction, and a controller and logic integrated with and/or executable by the controller. The logic is configured to reduce a local relative humidity in a vicinity of the tunnel junction by passing a current through the tunnel junction for at least a period of time that the tunnel junction would otherwise not have a current passing therethrough. A method according to one embodiment includes determining a relative humidity in an environment of a tunnel junction that is part of a magnetic structure and selecting an operating current from a range of allowable operating currents based on the determined relative humidity. The selected level of the current is high enough to heat the tunnel junction to a temperature which reduces a local relative humidity in a vicinity of the tunnel junction.

17 Claims, 17 Drawing Sheets

(56) References Cited

U.S. PATENT DOCUMENTS

| | | | |
|---|---|---|---|
| 8,508,887 B2* | 8/2013 | Wallash | 360/122 |
| 9,230,626 B2* | 1/2016 | Buhrman | G11C 11/18 |
| 9,323,499 B2* | 4/2016 | Hyde | G06F 7/588 |
| 9,431,034 B1* | 8/2016 | Iben | G11B 5/3106 |
| 2009/0273857 A1* | 11/2009 | Iben | G11B 5/3106 |
| | | | 360/97.12 |
| 2013/0112079 A1* | 5/2013 | Shih | B01D 53/261 |
| | | | 96/54 |
| 2014/0136583 A1* | 5/2014 | Hyde | G06F 7/588 |
| | | | 708/250 |
| 2014/0136755 A1* | 5/2014 | Hyde | G06F 15/7814 |
| | | | 711/103 |
| 2014/0136915 A1* | 5/2014 | Hyde | G06F 11/0703 |
| | | | 714/747 |
| 2014/0137119 A1* | 5/2014 | Hyde | G06F 21/56 |
| | | | 718/100 |
| 2014/0137271 A1* | 5/2014 | Hyde | G06F 12/0238 |
| | | | 726/30 |
| 2014/0167791 A1* | 6/2014 | Feyh | G01N 27/121 |
| | | | 324/694 |
| 2014/0203381 A1 | 7/2014 | Zhu et al. | |
| 2016/0028544 A1* | 1/2016 | Hyde | H04L 9/0869 |
| | | | 380/44 |
| 2016/0125898 A1* | 5/2016 | Ren | G11B 5/314 |
| | | | 369/13.33 |
| 2016/0208763 A1* | 7/2016 | Fernandez | F02P 5/045 |

OTHER PUBLICATIONS

Park et al., "Co/Pt multilayer based magnetic tunnel junctions using perpendicular magnetic anisotropy," Journal of Applied Physics, vol. 103, Mar. 2008, pp. 07A917-1-07A917-3.

Simmons, J.G., "Generalized formula for the electric tunnel effect between simple electrodes separated by a thin insulating film," Journal of Applied Physics, vol. 34, No. 6, Jun. 1963, pp. 1793-1803.

Tsunekawa et al., "Giant tunneling magnetoresistance effect in low-resistance CoFeB/MgO(001)/CoFeB magnetic tunnel junctions for read-head applications," Applied Physics Letters, vol. 87, Issue 7, Aug. 8, 2005, pp. 072503-1-072503-3.

Yuasa et al., "Giant room-temperature magnetoresistance in single-crystal Fe/MgO/Fe magnetic tunnel junctions," Nature Publishing Group, vol. 3, Dec. 2004, pp. 868-871.

* cited by examiner

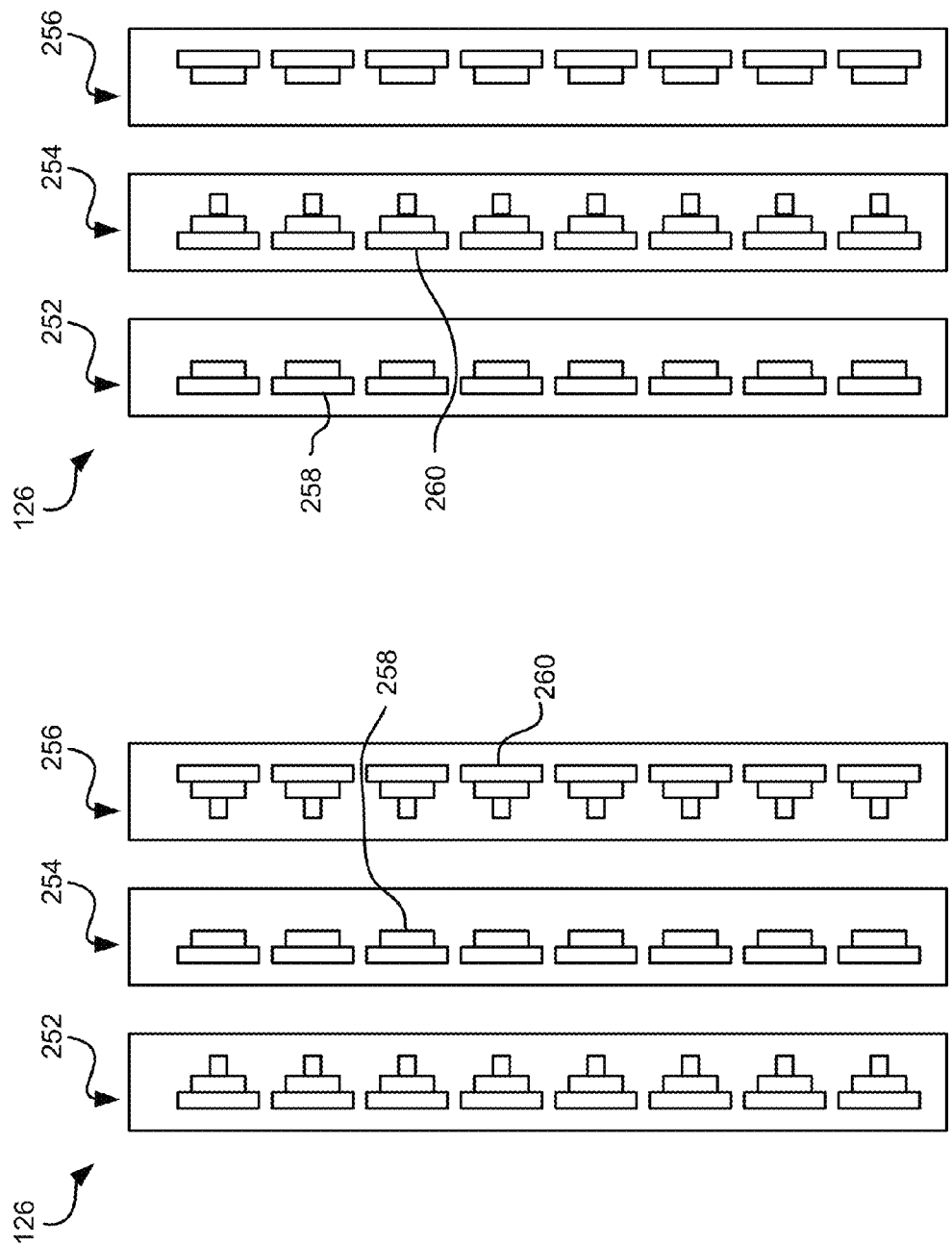

CORROSION AND/OR OXIDATION DAMAGE PROTECTION FOR TUNNEL JUNCTIONS

BACKGROUND

The present invention relates to data storage systems, and more particularly, this invention relates to the protection of tunnel junctions from corrosion and/or oxidation damage resulting from high relative humidity.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, the drive moves the magnetic tape over the surface of the tape head at high speed. Usually the tape head is designed to minimize the spacing between the head and the tape. The spacing between the magnetic head and the magnetic tape is crucial and so goals in these systems are to have the recording gaps of the transducers, which are the source of the magnetic recording flux in near contact with the tape to effect writing sharp transitions, and to have the read elements in near contact with the tape to provide effective coupling of the magnetic field from the tape to the read elements.

Reductions in shield-to-shield spacing also achieve increased read accuracy in magnetic readers. Recent advances in processing have enabled industry to utilize the quantum mechanical phenomenon of tunneling, whereby electrons can tunnel through a very thin insulating barrier separating two metals. For example tunnel junctions have been implemented in tunneling magnetoresistive (TMR) sensors. Additionally, tunnel junctions have been implemented in magnetic random access memory (MRAM).

BRIEF SUMMARY

A system according to one embodiment includes a magnetic structure having a tunnel junction, and a controller and logic integrated with and/or executable by the controller. The logic is configured to reduce a local relative humidity in a vicinity of the tunnel junction by passing a current through the tunnel junction for at least a period of time that the tunnel junction would otherwise not have a current passing therethrough.

A method according to one embodiment includes determining a relative humidity in an environment of a tunnel junction that is part of a magnetic structure and selecting an operating current from a range of allowable operating currents based on the determined relative humidity. The selected level of the current is high enough to heat the tunnel junction to a temperature which reduces a local relative humidity in a vicinity of the tunnel junction.

A computer program product according to one embodiment includes a computer readable storage medium having program instructions embodied therewith, the program instructions readable and/or executable by a controller to cause the controller to cause to pass, by the controller, a current through a tunnel junction of a magnetic structure for at least a period of time that the tunnel junction would otherwise not have a current passing therethrough. The current is high enough to heat the tunnel junction to a temperature which reduces a local relative humidity in a vicinity of the tunnel junction.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 3 is a partial tape bearing surface view of a magnetic head having a write-read-write configuration.

FIG. 4 is a partial tape bearing surface view of a magnetic head having a read-write-read configuration.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a system includes a magnetic structure having a tunnel junction, and a controller and logic integrated with and/or executable by the controller. The logic is configured to reduce a local relative humidity in a vicinity of the tunnel junction by passing a current through the tunnel junction for at least a period of time that the tunnel junction would otherwise not have a current passing therethrough.

In another general embodiment, a method includes determining a relative humidity in an environment of a tunnel junction that is part of a magnetic structure and selecting an operating current from a range of allowable operating currents based on the determined relative humidity. The selected level of the current is high enough to heat the tunnel junction to a temperature which reduces a local relative humidity in a vicinity of the tunnel junction.

In yet another general embodiment, a computer program product includes a computer readable storage medium having program instructions embodied therewith, the program instructions readable and/or executable by a controller to cause the controller to cause to pass, by the controller, a current through a tunnel junction of a magnetic structure for at least a period of time that the tunnel junction would otherwise not have a current passing therethrough. The current is high enough to heat the tunnel junction to a temperature which reduces a local relative humidity in a vicinity of the tunnel junction.

Figure 1A:
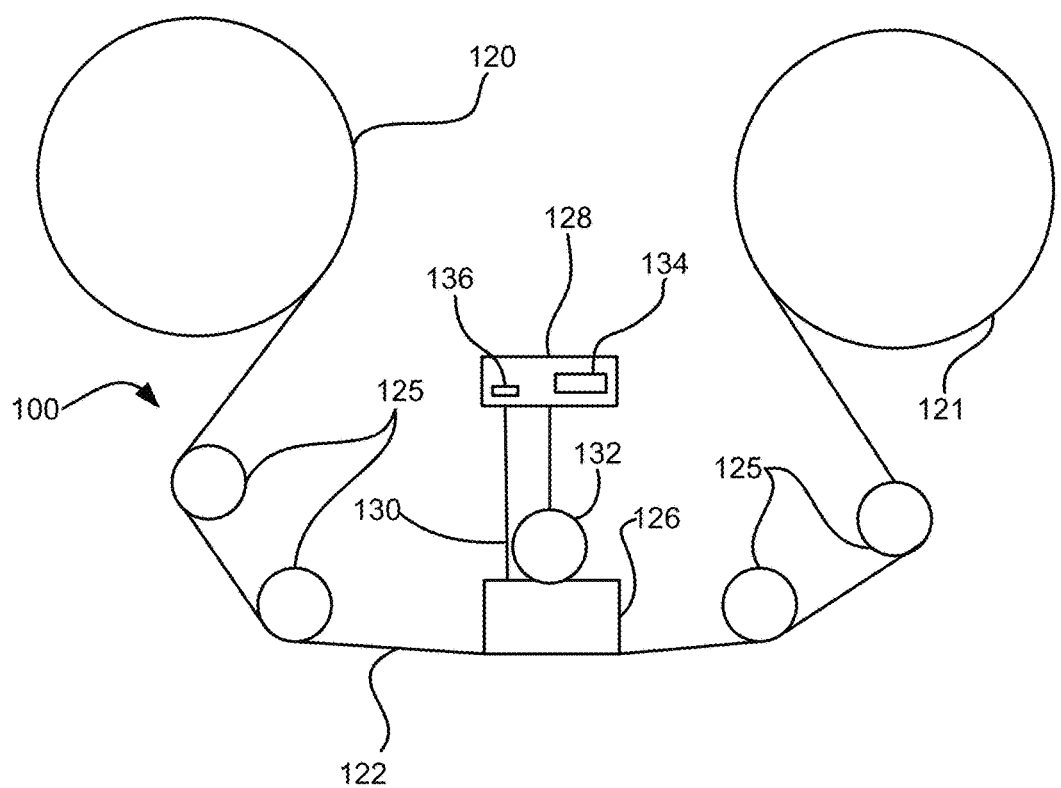
FIG. 1A is a schematic diagram of a simplified tape drive system according to one embodiment.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the drive 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may operate under logic known in the art, as well as any logic disclosed herein. The controller 128 may be coupled to a memory 136 of any known type, which may store instructions executable by the controller 128. Moreover, the controller 128 may be configured and/or programmable to perform or control some or all of the methodology presented herein. Thus, the controller may be considered configured to perform various operations by way of logic programmed into a chip; software, firmware, or other instructions being available to a processor; etc. and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (integral or external) to send and receive the data and for controlling the operation of the tape drive 100 and communicating the status of the tape drive 100 to the host, all as will be understood by those of skill in the art.

Figure 1B:
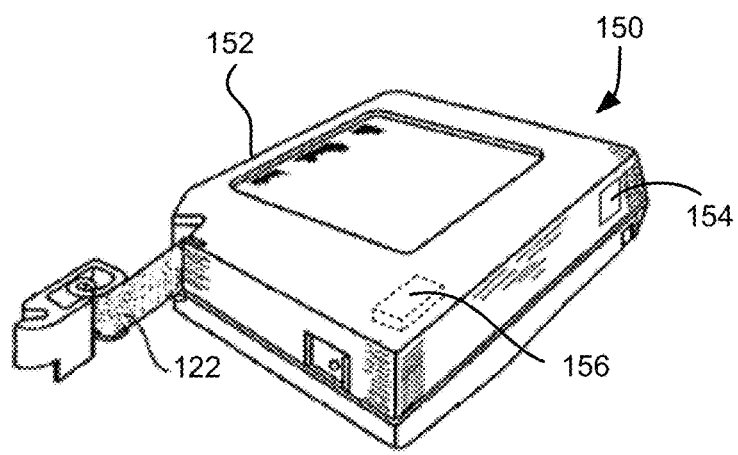
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some embodiments, the nonvolatile memory 156 may be embedded inside the housing 152, as shown in FIG. 1B. In more embodiments, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 2:
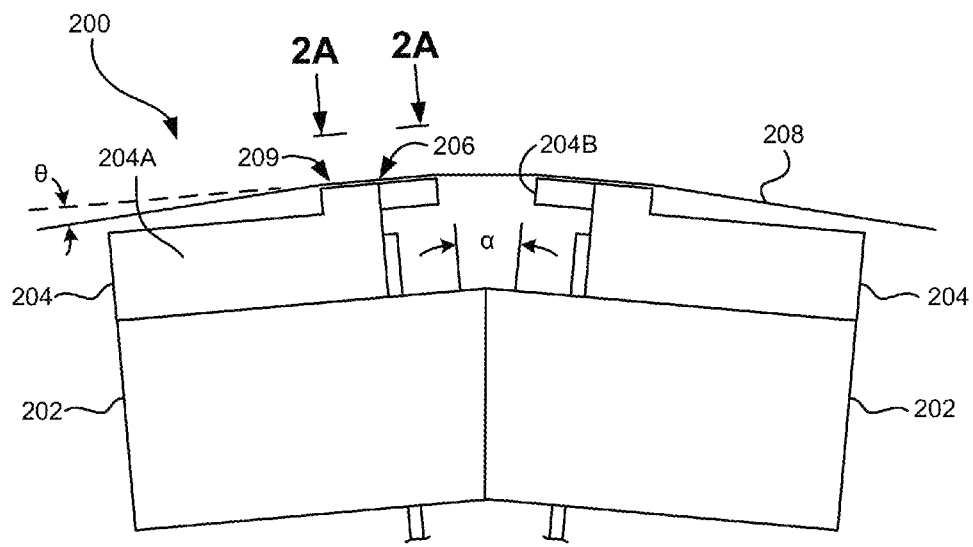
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2A:
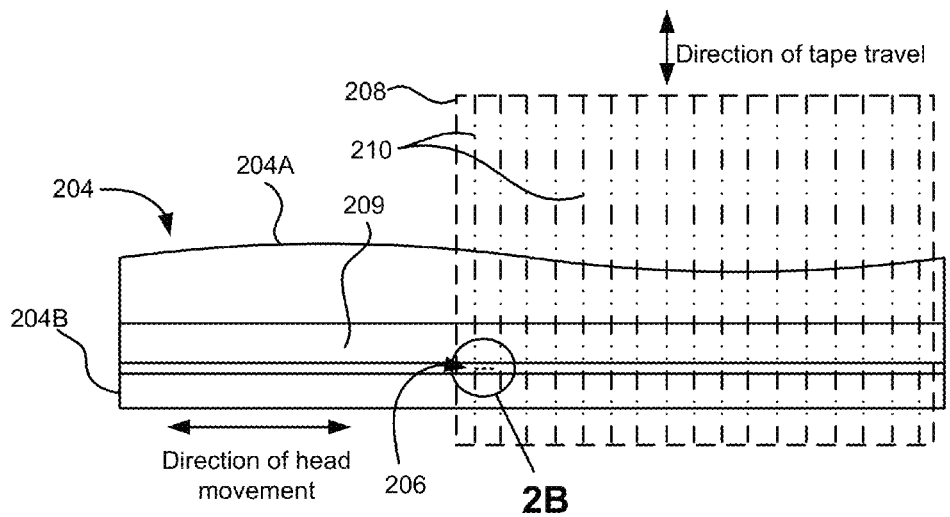
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4 to 22 data bands, e.g., with 16 data bands and 17 servo tracks 210, as shown in FIG. 2A on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2B:
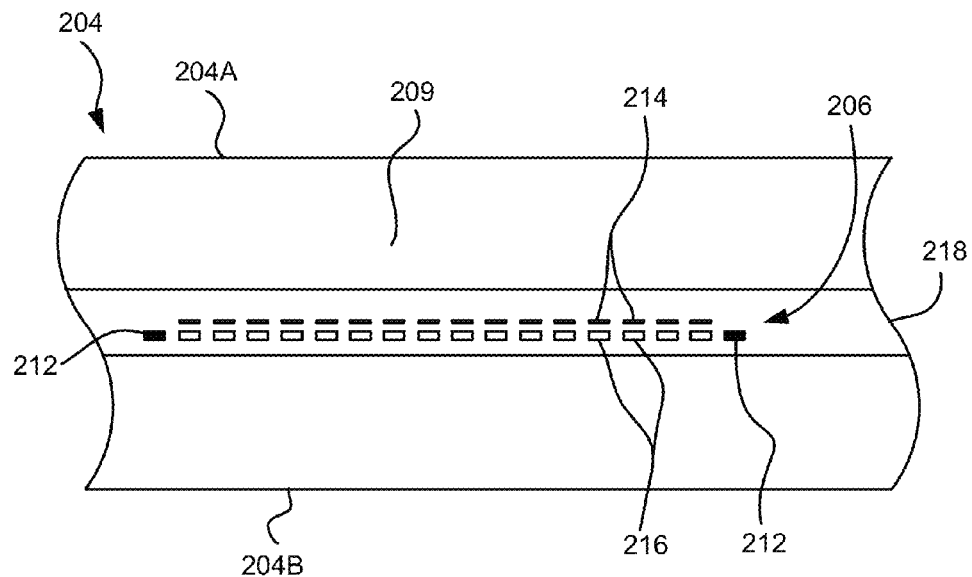
FIG. 2B is a detailed view taken from Circle 2B of FIG. 2A.

FIG. 2B depicts a plurality of readers and/or writers 206 formed in a gap 218 on the module 204 in Circle 2B of FIG. 2A. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2B, the readers 216 and writers 214 may also be arranged in an interleaved configuration. Alternatively, each array of readers and/or writers 206 may be readers or writers only, and the arrays may contain one or more servo readers 212. As noted by considering FIGS. 2 and 2A-B together, each module 204 may include a complementary set of readers and/or writers 206 for such things as bi-directional reading and writing, read-while-write capability, backward compatibility, etc.

Figure 2C:
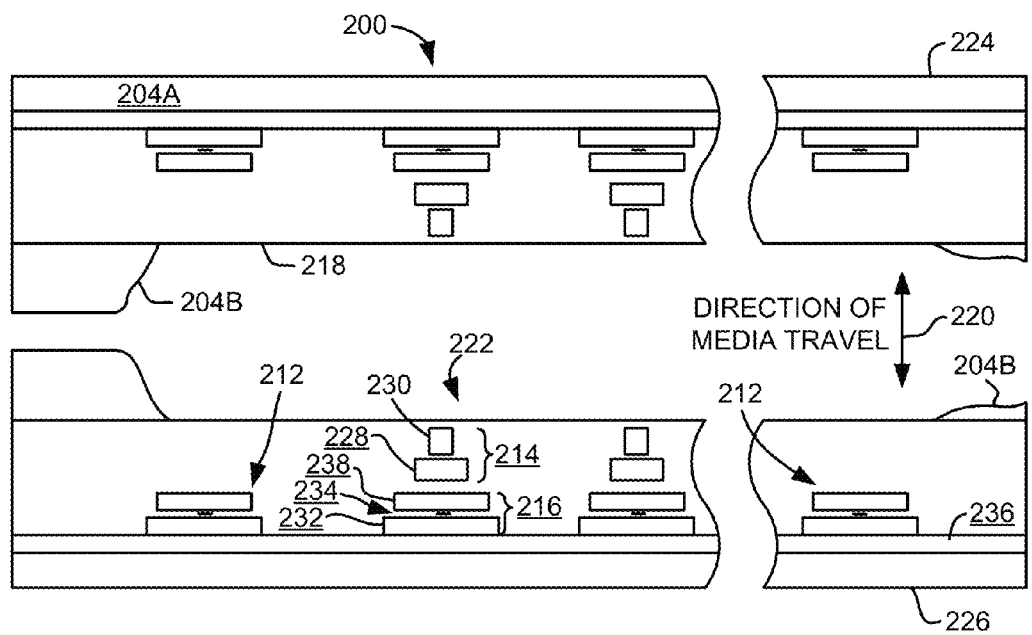
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeable. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (—), CZT or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, TMR, etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further embodiments, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
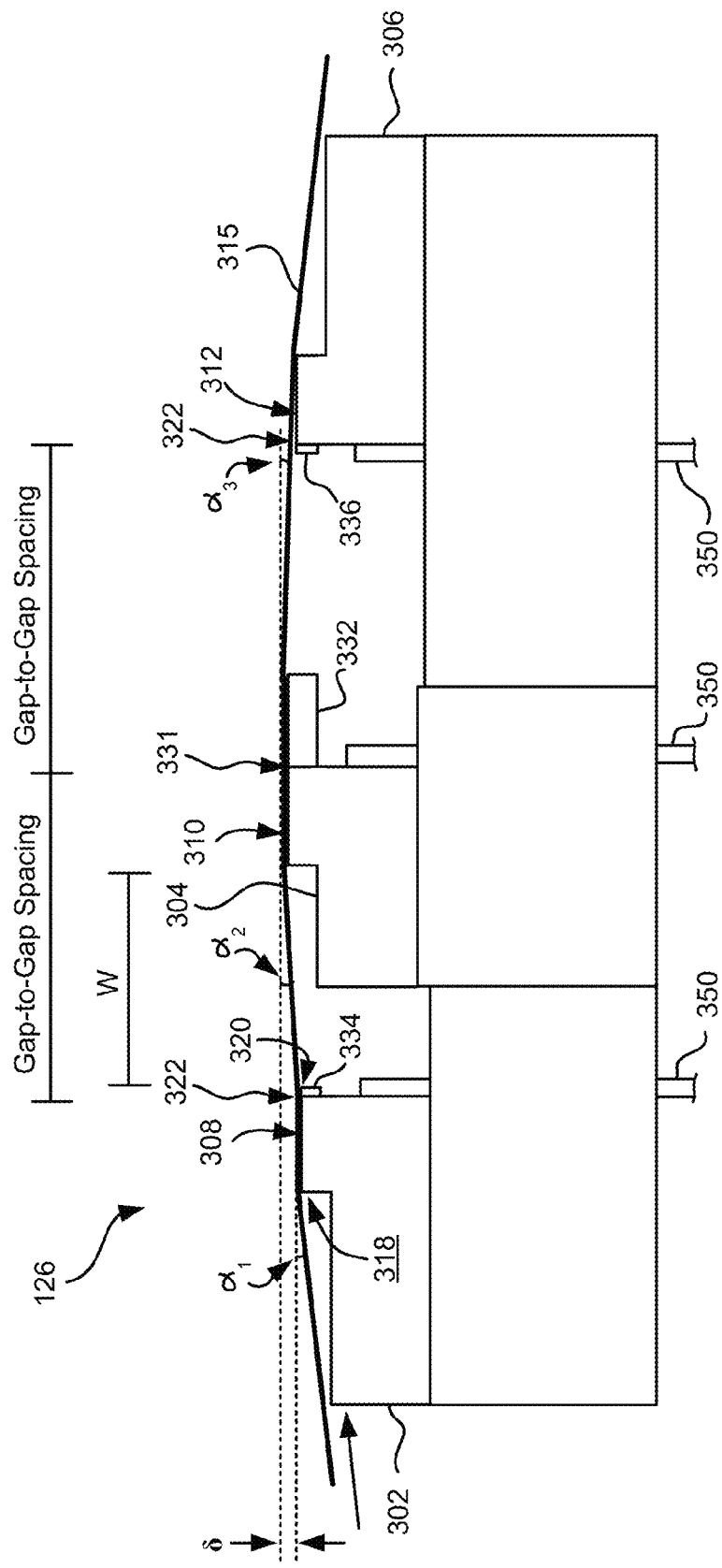
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three module design for tape moving in the indicated direction. The third module 306 will be referred to as the "trailing" module. The trailing module follows the middle module and is the last module seen by the tape in a three module design. The leading and trailing modules 302, 306 are referred to collectively as outer modules. Also note that the outer modules 302, 306 will alternate as leading modules, depending on the direction of travel of the tape 315.

Figure 6:
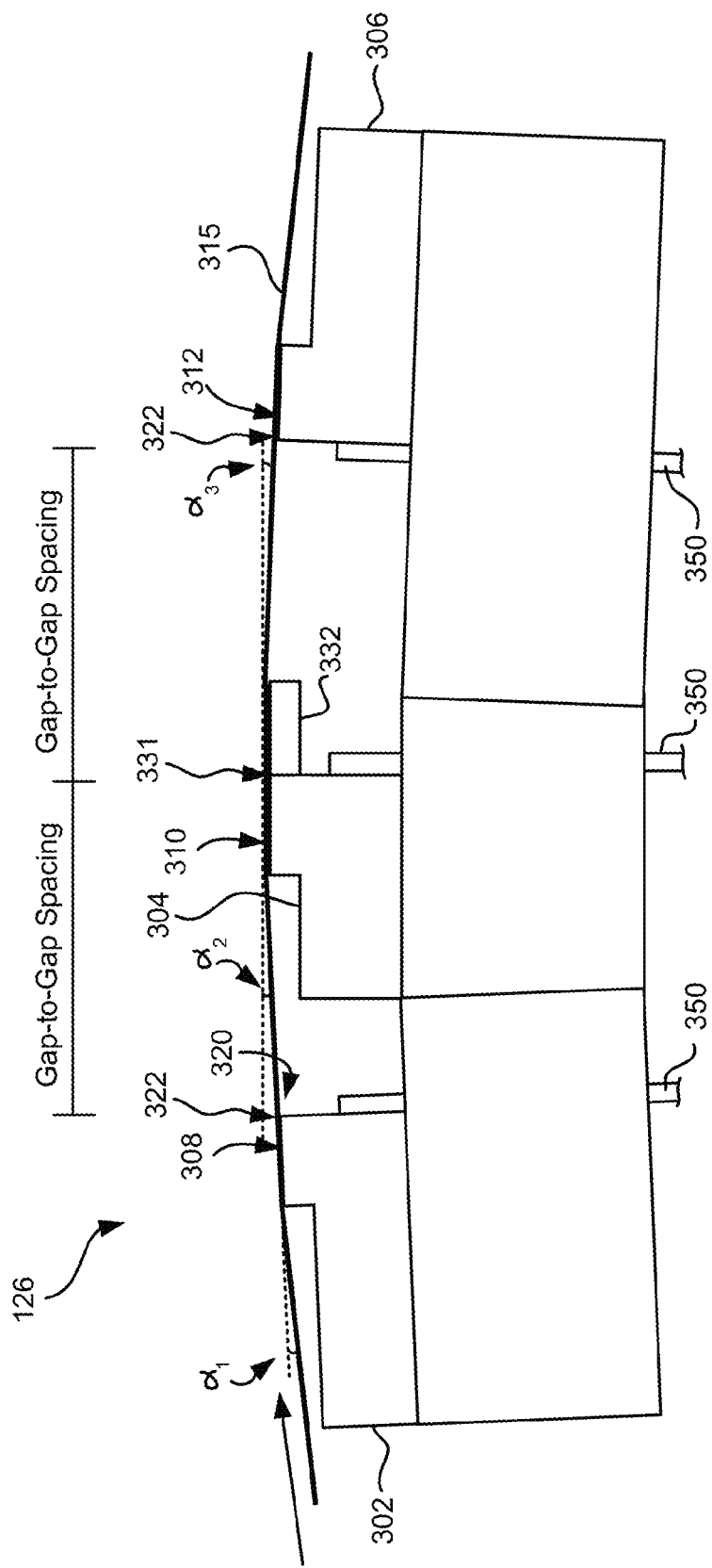
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located towards the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used LTO tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
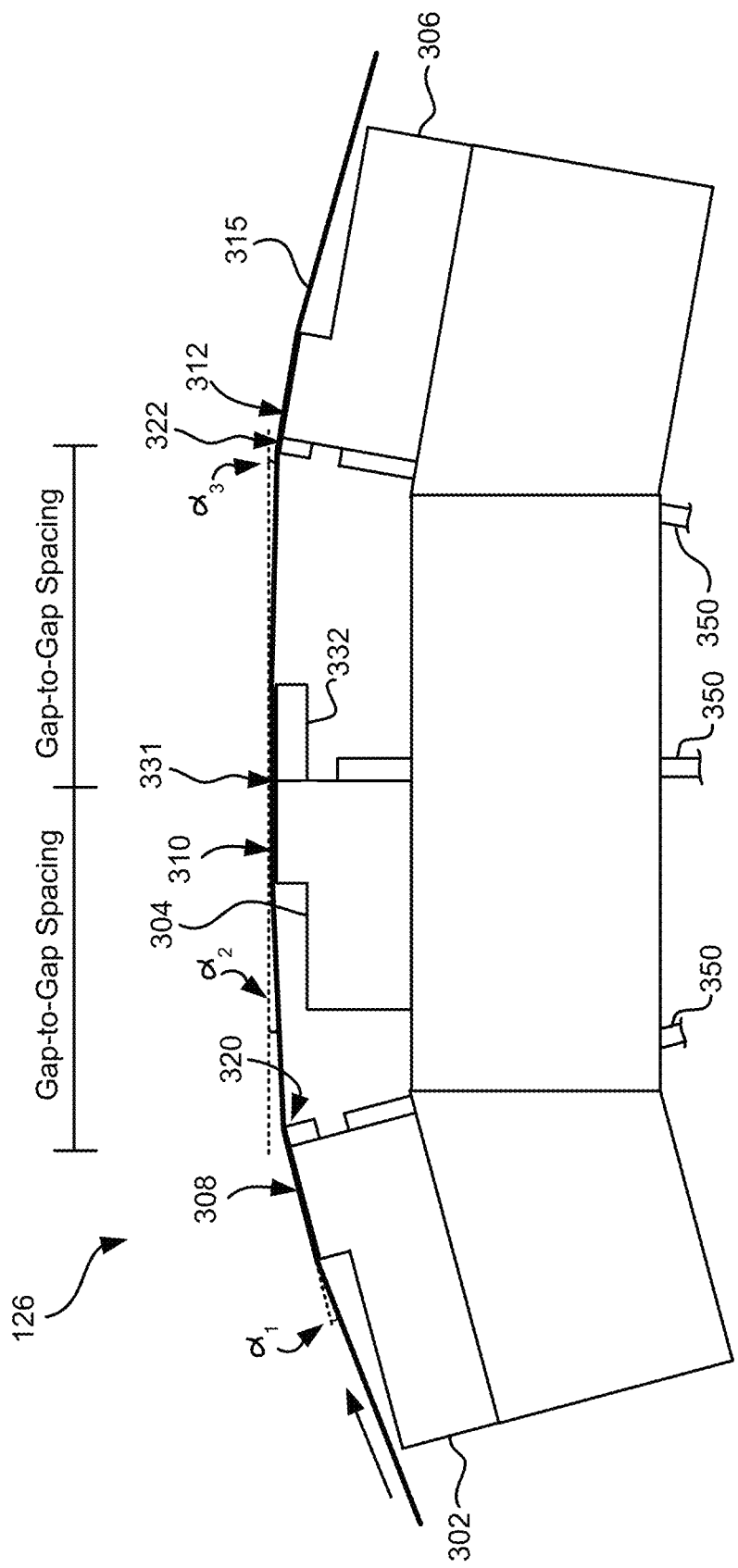
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore a preferred embodiment has a write-read-write configuration, which may use shortened closures that thus allow closer gap-to-gap separation.

Additional aspects of the embodiments shown in FIGS. 6 and 7 are similar to those given above.

A 32 channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other embodiments, the modules may be constructed as a unitary body. Those skilled in the art, armed with the present teachings, will appreciate that other known methods of manufacturing such heads may be adapted for use in constructing such heads.

In electronic devices, metals are ubiquitous due to their ability to conduct current. However, they are also sensitive to corrosion. Conversely, insulators including metal oxides (e.g., magnesium-oxide (MgO), Aluminum-Oxide, etc.) are poor conductors and are not associated with the phenomenon of corrosion. As previously mentioned, recent advances in processing have enabled industry to utilize the quantum mechanical phenomenon of tunneling, whereby electrons can tunnel through a very thin insulating barrier separating two metals. For example, tunnel junctions, also known as tunnel barrier layers, are used in TMR sensors, MRAM, etc.

TMR sensors and MRAM may be made with oxides such as MgO and AlO. Since the foregoing metals MgO and AlO are already oxidized, one skilled in the art would not associate corrosion with them. However, contrary to conventional wisdom, experimentation conducted by the inventors has surprisingly discovered that the thin oxides (e.g., on the order of 1 nm thick) used in TMR and MRAM devices may actually be corroded by very minute levels of contaminants (e.g., such as HCl and/or other acidic gases) in the presence of high humidity. Moreover, the inventors discovered that oxidation and/or corrosion experienced in tunnel junctions resulted in an increased resistance thereof. While even small increases in resistance of tunnel junctions degrade the performance thereof, larger increases in the resistance of tunnel junctions ultimately render them nonfunctional.

The inventors surprisingly discovered that modest power levels (e.g., low enough to not cause damage to the tunnel junction) may be used to protect both the tunnel junctions and the surrounding layers from corrosion and/or oxidation. Some of the embodiments described herein may be implemented to reduce the corrosion and/or oxidation experienced by a tunnel junction of a magnetic recording sensor (e.g., a TMR sensor) and/or TMR-based MRAM by application of an adjusted current across the tunnel junction to reduce localized relative humidity. According to some approaches, by adjusting the current applied to a magnetic sensor such that a controlled increase in temperature is experienced at the tunnel junction, the relative humidity in a vicinity of the tunnel junction may desirably be reduced. As will be described in further detail below, the reduced relative humidity experienced in a vicinity of the tunnel junction was both unexpected and a surprising result. It should be noted that a "vicinity" of the tunnel junction as used herein includes at least the immediate interface between the tunnel junction and a surrounding environment; moreover, the vicinity may extend farther away from the aforementioned interface, e.g., such as the interface of the immediately surrounding metal layers and the environment, depending on the embodiment.

Figure 8A:
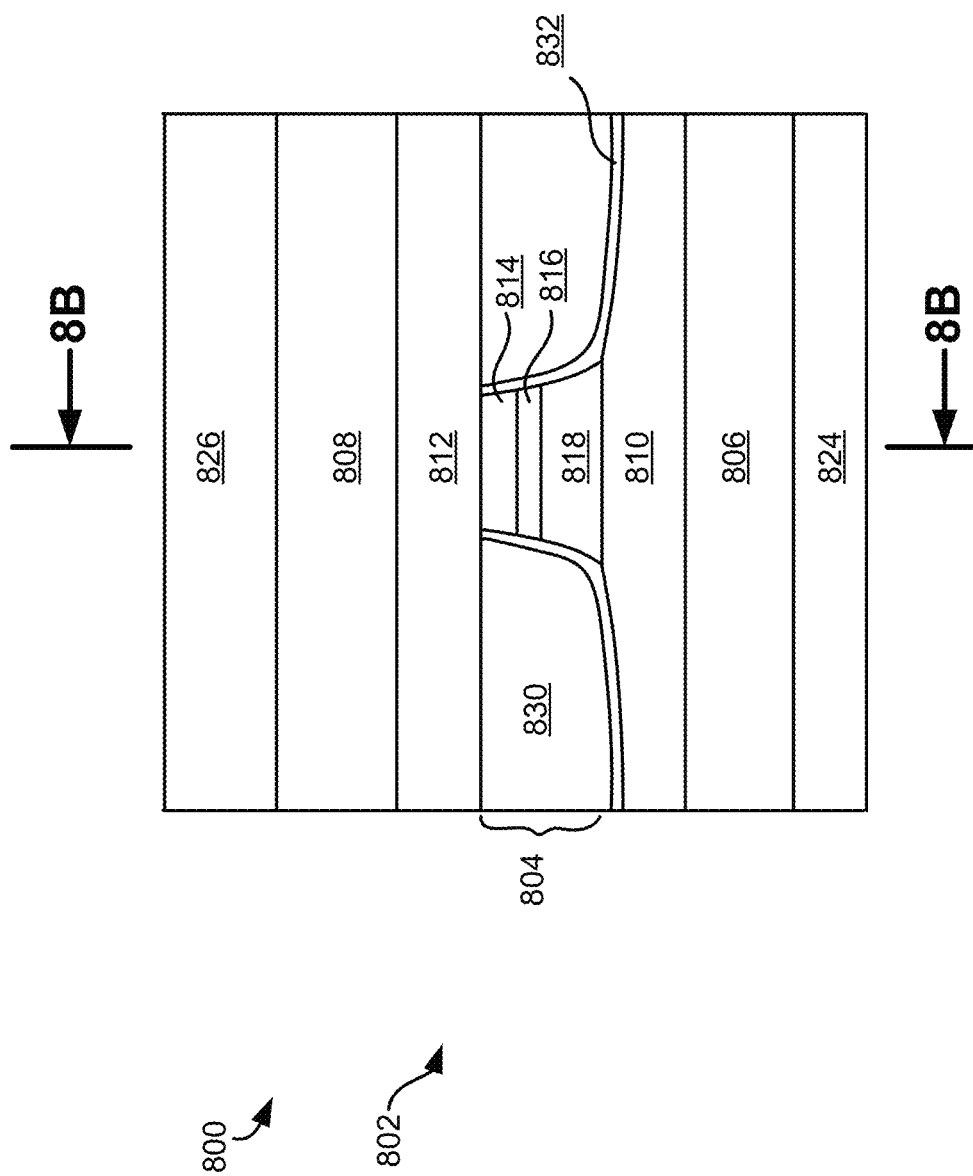
FIG. 8A is a partial media facing side view of a sensor stack, according to one embodiment.
Figure 8B:
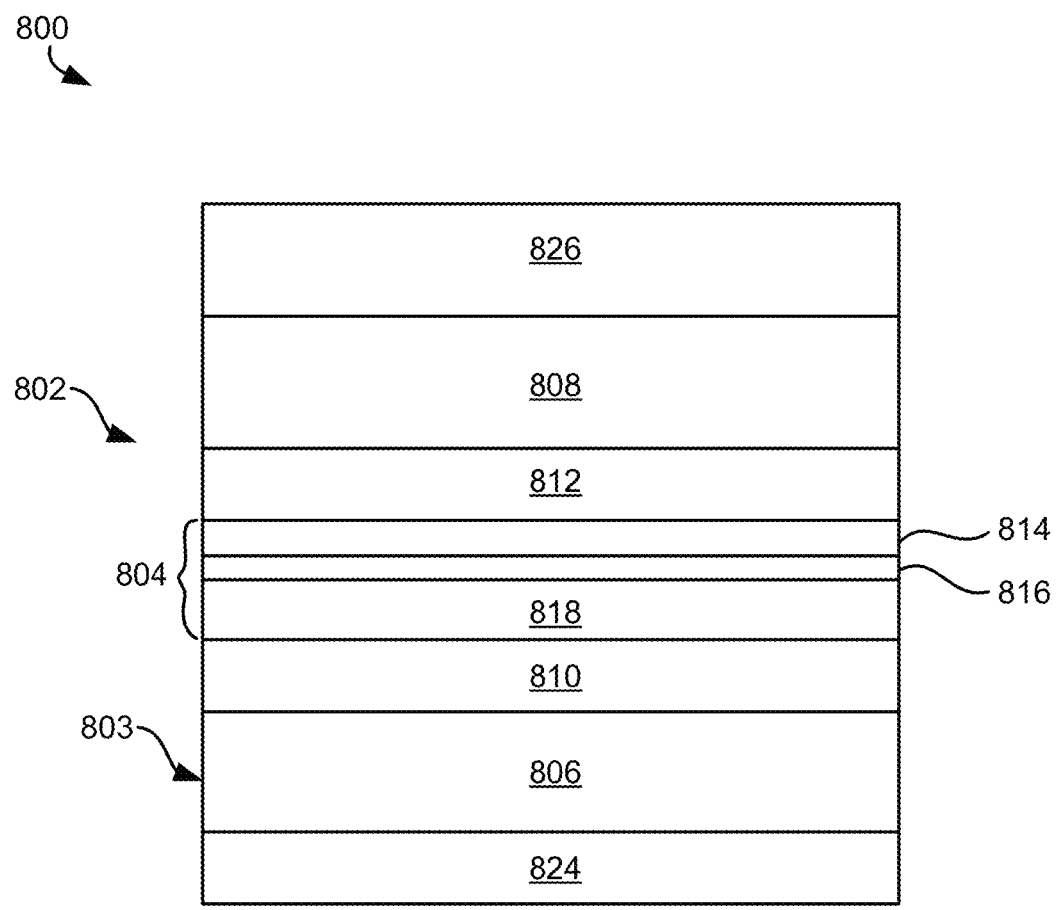
FIG. 8B is a partial cross-sectional view taken from Line 8B-8B of FIG. 8A.

Looking to FIGS. 8A-8B, a system 800 is illustrated in accordance with one embodiment. As an option, the present system 800 may be implemented in conjunction with features from any other embodiment listed herein, such as those described with reference to the other FIGS. However, such system 800 and others presented herein may be used in various applications and/or in permutations which may or may not be specifically described in the illustrative embodiments listed herein. Further, the system 800 presented herein may be used in any desired environment. Thus FIGS. 8A-8B (and the other FIGS.) may be deemed to include any possible permutation.

The system 800 includes a magnetic structure 802 having a media facing side 803. Depending on the embodiment, the magnetic structure 802 may vary in type. However, it is preferred that the magnetic structure has a tunnel junction as described below. It follows that, in some embodiments the magnetic structure 802 may be part of a magnetic memory element (e.g., MRAM), in other embodiments the magnetic structure may be a TMR sensor, while in still other embodiments the magnetic structure may be of a different type, e.g., depending on the desired embodiment.

The present embodiment illustrated in FIGS. 8A-8B includes the magnetic structure 802 as a TMR read sensor structure. Accordingly, the magnetic structure 802 includes an active TMR region 804 in accordance with a TMR read sensor. The magnetic structure 802 also includes magnetic shields 806, 808 flanking (sandwiching) the TMR region 804, and electrically conductive, non-magnetic gaps 810, 812 between the TMR region 804 and the magnetic shields 806, 808. Except as otherwise described herein, the various components of system 800 of FIGS. 8A-8B may be of conventional materials and designs, as would be understood by one skilled in the art.

System 800 may also include overcoat and undercoat layers 824, 826, which may have any conventional construction, e.g., may include an alumina material, a lead material, etc. Furthermore, the active TMR region 804 includes a free layer 814, a tunnel junction 816 (also known as a tunnel barrier layer) and a reference layer 818 (e.g., a pinned layer). The reference layer 818 may be an AP pinned layer as would be appreciated by one skilled in the art upon reading the present description. An insulating layer 832 may also be interposed between hard bias layers 830 and the active TMR region 804 to prevent parasitic current flow parallel to current flow through the sensor. Magnetic structure 802 may further be coupled to a controller (e.g., see controller 128 of FIG. 1A) having logic integrated with and/or executable by the controller. According to an exemplary approach, the logic may be configured to cause the controller to perform any one or more of the operations described below with reference to method 900.

Referring still to FIGS. 8A-8B, according to various embodiments, the free layer 814, the tunnel junction 816 and/or the reference layer 818 may include construction parameters, e.g., materials, dimensions, properties, etc., according to any of the embodiments described herein, and/or conventional construction parameters, depending on the desired embodiment. Illustrative materials for the tunnel junction 816 include amorphous and/or crystalline forms of, but are not limited to, titanium oxides, magnesium oxides, and alumina. In one approach, the tunnel junction 816 may be part of a tunnel magnetoresistance read element of a magnetic head.

During read operations, a normal operation current is passed through magnetic structure 802 in a direction perpendicular to the plane of deposition of the tunnel junction 816. As would be appreciated by one skilled in the art, the normal operation current is used to detect changes in local magnetic fields as magnetic media is passed by the TMR region 804. As a result, data may be read from data tracks on the magnetic media by detecting changes in the flow of current passing through the TMR region 804.

Conventionally, a normal operation current for a TMR sensor is high enough to achieve tunneling through the tunnel junction, but low enough to prevent unnecessary power consumption. Moreover, the normal operation current is shut off when conventional TMR sensors are not in use, e.g., when data is not being read. Moreover, as alluded to above, contrary to conventional wisdom, the inventors discovered that corrosion and oxidation develop on the thin oxides used in TMR and MRAM devices by minute levels of contaminants (e.g., such as HCl and/or other acidic gases) in the presence of high humidity. In fact, the inventors were surprised to discover that thin oxides used in TMR and MRAM devices corroded and/or oxidized more easily than layers in GMR sensors subjected to the same environmental conditions (e.g., see the experimental data provided below). Moreover, the oxidation and corrosion experienced on the thin oxides of the tunnel junctions resulted in an increased resistance thereof. While even small increases in resistance of tunnel junctions degrade the performance thereof, larger increases in the resistance of tunnel junctions ultimately render them non-functional.

Initially, the inventors believed that the relative humidity causing the experienced oxidation and corrosion could not be counteracted. The inventors thought it would not be possible to achieve a sufficient amount of heat at the tunnel junction and the surrounding vicinity to reduce the relative humidity enough to have a noticeable effect on the prolonged performance of the tunnel junction and magnetic structure as a whole while also maintaining functionality thereof. For example, it was found that use of the bulk thermal properties of the metals surrounding tunnel junction layers in sensors resulted in calculations of current levels which are incorrect. Specifically, the use of the bulk thermal conductivity of said layers in calculating the temperature rise of a tunnel junction versus power results in significantly lower Joule heating temperature rise versus power than is achieve in actual devices. Thus, calculating the necessary current through a tunnel junction using the bulk thermal conductivity results in the need for much higher current values than those actually required to heat the tunnel junction sufficiently to reduce corrosion of the thin tunnel junction layer, thereby resulting in drastically inaccurate results. The higher values of the currents through and voltages across the tunnel junction to heat the tunnel junction sufficiently to protect against corrosion could lead to thermal degradation of the tunnel junction layer itself and thus could not be used.

However, in sharp contrast to what would be expected by those skilled in the art, the inventors discovered that by applying a modest current to the magnetic structure such that it passes through the tunnel junction, a local relative humidity in a vicinity of the tunnel junction and surrounding layers may desirably be reduced. These counterintuitive results are again supported by the experimental data provided below. A modest current may be defined as a current that is not expected to induce noticeable thermal degradation to the tunnel junction over a prolonged period of application of the current, such as greater than 5000 hours, preferably greater than 25000 hours.

As a result, the inventors made attempts to overcome the problematic corrosion and oxidization by reducing the relative humidity at least in a vicinity of the tunnel junction in different magnetic structures (e.g., see 802 of FIGS. 8A-8B). The following procedure is especially useful in contact recording environments such as tape environments, where the head is not protected from the environment like a disk head is in a hard disk drive enclosure.

Figure 9:
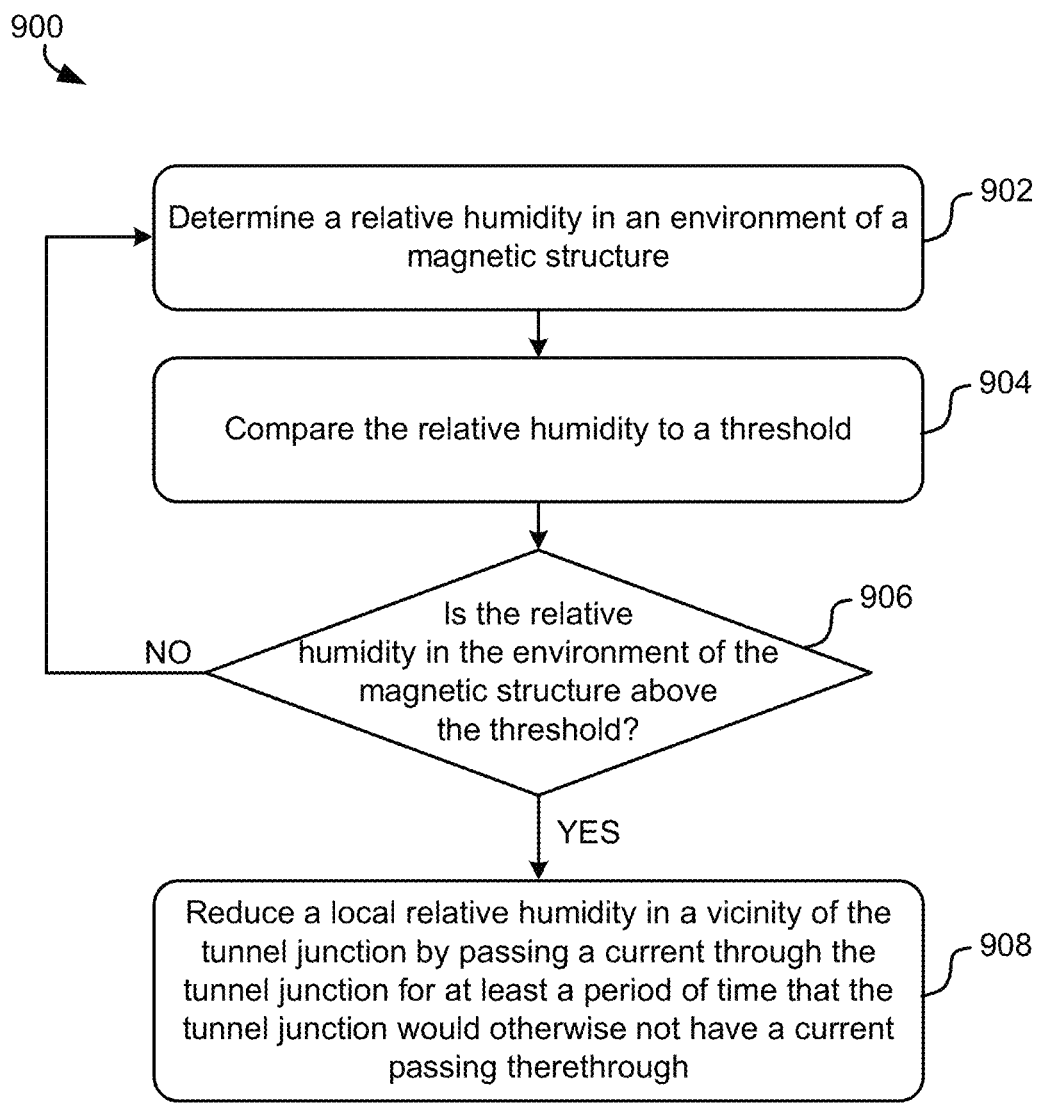
FIG. 9 is a flowchart of a method according to one embodiment.

Looking to FIG. 9, a method 900 for reducing the relative humidity is depicted in accordance with one embodiment. As an option, the present method 900 may be implemented in conjunction with features from any other embodiment listed herein, such as those described with reference to the other FIGS., such as FIGS. 8A-8B. However, such method 900 and others presented herein may be used in various applications and/or in permutations which may or may not be specifically described in the illustrative embodiments listed herein. Further, the method 900 presented herein may be used in any desired environment. Thus FIG. 9 (and the other FIGS.) may be deemed to include any possible permutation.

Method 900 includes determining a relative humidity in an environment of a magnetic structure which may have a tunnel junction. See operation 902. In some embodiments the environment may include the area inside a drive housing in which the magnetic structure is located. However, in other embodiments the environment may include the volume of space located within a certain distance from the magnetic structure and/or the tunnel junction itself. It follows that an environment of the magnetic structure may vary depending on the embodiment.

The relative humidity may be determined for an environment of the magnetic structure by using one or more sensors capable of determining a relative humidity. Depending on the amount of dispersion experienced in the given environment of the magnetic structure, a different number of relative humidity sensors may be dispersed throughout the environment. For example, embodiments having low dispersion (e.g., a large number of humidity gradients across the environment) may include a larger number of relative humidity sensors scattered throughout the environment such that an accurate average relative humidity value may be calculated. Alternatively, embodiments having high dispersion (e.g., a low number of humidity gradients across the environment) may include fewer relative humidity sensors placed in the environment. In the case of a tape or disk drive using a TMR sensor, having a relative humidity sensor inside the drive is optimum. If it is not possible to mount a relative humidity sensor inside the drive, mounting the sensor in a library containing the drive is acceptable. In a further embodiment, the sensor may be mounted in the same room as the TMR sensor.

Referring still to FIG. 9, the relative humidity is compared to a threshold in operation 904. Moreover, decision 906 determines whether the relative humidity in the environment of the magnetic structure is above the threshold. Depending on the approach, the threshold may be predetermined, calculated using information pertaining to the magnetic structure (e.g., a frequency of use, magnetic structure type, robustness, etc.), etc. Moreover, according to different approaches, the threshold may be a predetermined value, such as 80% relative humidity, 60% relative humidity, 50% relative humidity, 40% relative humidity, etc., in an environment to which the tunnel junction is exposed, as described in further detail below. It should also be noted that determining whether a value is above a threshold is in no way intended to limit the invention. Rather, an equivalent determination may be made as to whether a value (e.g., the relative humidity) is below a threshold, within a predefined range, outside a range, etc.

Method 900 proceeds to operation 908 in response to determining that the relative humidity in the environment of the magnetic structure is above the threshold in decision 906. Operation 908 includes reducing a local relative humidity in a vicinity of a tunnel junction of the magnetic structure by passing a current through the tunnel junction for at least a period of time when the tunnel junction would otherwise not have a current passing therethrough. It follows that, the current is passed through the tunnel junction in response to determining that the relative humidity in the environment of the magnetic structure is above the threshold. Preferably, the current is elevated, e.g., higher than the normal operation current.

Another consideration for whether to use an elevated bias current is the allowable operating current range usable during normal operation, i.e., for reading. In the case of a read/write head using a TMR sensor, the drive code may have a range of operating bias currents, which may define the allowable operating current range.

Normally one uses performance as the criteria for select an operating bias current. For example, the allowable operating current range may include only those currents at which the TMR sensor is able to read data from a magnetic medium such as a magnetic recording tape. The upper limit on allowable current may be based at least in part in consideration of reliability of the drive and/or degradation induced by elevated bias currents, even though the head/drive may function at the elevated bias current for some time period. For example, the allowable operating current range may include only those currents that are below a current believed to damage the structure.

Protection against corrosion may be another criterion to be used in setting the operating current. For example, if a TMR sensor will function properly at a current range of 1 to 5 mA, but in a humid environment the head will only be protected by currents of 4 mA or above, then the controller executing the drive code may then set the allowable current range during the humid time period, or all the time, to be between 4 and 5 mA, disallowing currents below 4 mA to avoid potential corrosion.

In one exemplary process, the relative humidity in an environment of a tunnel junction is determined. An operating current may be selected from a range of allowable operating currents based on the determined relative humidity, the selected level of the current being high enough to heat the tunnel junction to a temperature which reduces a local relative humidity in a vicinity of the tunnel junction. The relative humidity may be determined using a humidity sensor, e.g., in a manner discussed elsewhere herein.

A combination of the foregoing features may also be used, e.g., application of a current from the range of allowable operating currents during reading operations, and application of a second current during periods of nonuse, where the second current may be within the range, higher than the range, etc.

As previously described, applying localized heating may effectively reduce a local relative humidity. Moreover, as would be appreciated by one skilled in the art upon reading the present description, if the resistance of an object remains about constant while the current passing therethrough is increased, the voltage drop across the object is increased, thereby resulting in an increased dispersion of energy in the form of heat. Thus, by passing an elevated level of current through the tunnel junction, the tunnel junction may be heated and a local relative humidity in a vicinity of the tunnel junction is reduced.

Accordingly, it is desirable that the level of current is high enough to heat the tunnel junction to a temperature which reduces the local relative humidity to a desired level. In preferred approaches, the level of the current applied to the tunnel junction may be equal to or greater than a normal operation current level used when the magnetic structure is operating for its intended use. However, the level of current and/or the amount of heat required to reduce the local relative humidity by a desired amount may vary depending on the embodiment. For example, the level of current may also preferably low enough to avoid the dielectric breakdown of the tunnel junction, as will be described in further detail below. According to another example, the method 1000 of FIG. 10 below introduces an process of determining a level of current to pass through the tunnel junction to reduce the local relative humidity by a desired amount; however, different formulas, processes, etc. are introduced in the experimental data provided below, any combination of which may be implemented depending on the desired embodiment. In some approaches, the level of the current applied to the tunnel junction may actually be less than a normal operation current level used when the magnetic structure is operating for its intended use, e.g., so long as the level of the current is above a minimum limit able to reduce the local relative humidity by a desired amount to ensure protection against corrosion and/or oxidization of at least the tunnel junction. Thus, the level of current as used herein is in no way intended to limit the invention. Rather, the level of current applied to a magnetic structure may be considered as a bias current as used herein (not to be confused with the normal operating current) having a value that varies depending on the desired embodiment.

Moreover, the effects of relative humidity on the tunnel junction may be experienced regardless of whether the magnetic structure is in use or not. Thus it is preferred that the operations of method 900 are performed continuously when the tunnel junction is subjected to levels of relative humidity above a given or dynamically calculated threshold. According to different approaches, the threshold may be 80% relative humidity, 60% relative humidity, 50% relative humidity, 40% relative humidity, a variable value, etc. in an environment to which the tunnel junction is exposed. For example, if it is determined that a relative humidity in the environment of the magnetic structure is above a threshold, a level of current is preferably applied to the tunnel junction even when the magnetic sensor is not in use. It follows that a current may be passed through the tunnel junction for at least a period of time when the tunnel junction would otherwise not have a current passing therethrough. In other words, the current may be applied to the tunnel junction even when the magnetic structure is not in use for its primary purpose, e.g., is not in normal use. In a magnetic head, for example, its primary purpose may be detecting magnetic transitions on a magnetic medium.

Various factors may be considered in determining when and/or how long a current should be applied to the magnetic structure. For example, factors including, but not limited to relative humidity levels, power consumption vs. power available, extent of exposure to humidity, presence of contaminants in the magnetic structure environment (e.g., unintended contaminants, intentionally injected contaminants such as anti-bacterial agents, etc.), run time vs. standby time, heat to which a sensor is exposed, dielectric breakdown, etc. may determine when and/or how long a current should be applied to the tunnel junction. Thus, the foregoing factors may have an effect on the threshold implemented. According to an exemplary approach, if a low amount of power is available, there is a low presence of contaminants, and/or a high run time vs. standby time ratio, a higher threshold, e.g., 70% relative humidity, may be implemented to ensure desirable functionality and protection while also conserving available resources. Alternatively, if a high amount of power is available, there is a high presence of contaminants, and/or a low run time vs. standby time ratio, a lower threshold, e.g., 50% relative humidity, may be implemented to ensure adequate functionality and protection.

Referring back to decision 906, method 900 returns to operation 902 in response to determining that the relative humidity in the environment of the magnetic structure is not above the threshold in decision 906. In other words, a current is not passed through the tunnel junction in response to determining that the relative humidity in the environment of the magnetic structure is below a threshold. Upon returning to operation 902, method 900 may proceed to determine an updated relative humidity in the environment of the magnetic structure and repeat operation 904 as well as decision 906 accordingly. Moreover, it should again be noted that determining whether a value is above a threshold is in no way intended to limit the invention. Rather, an equivalent determination may be made as to whether a value (e.g., the relative humidity) is equivalently below a threshold, within a predefined range, outside a range, etc.

As mentioned above, FIG. 10 illustrates a method 1000 for determining a level of current to pass through a tunnel junction in accordance with one embodiment. As an option, the present method 1000 may be implemented in conjunction with features from any other embodiment listed herein, such as those described with reference to the other FIGS., such as FIGS. 8A-9. However, such method 1000 and others presented herein may be used in various applications and/or in permutations which may or may not be specifically described in the illustrative embodiments listed herein. Further, the method 1000 presented herein may be used in any desired environment. Thus FIG. 10 (and the other FIGS.) may be deemed to include any possible permutation.

Method 1000 includes determining the local relative humidity and a local temperature in a vicinity of the tunnel junction. See operation 1002. The local relative humidity and/or local temperature may be determined for a vicinity of the tunnel junction by using sensors capable of determining a relative humidity and/or temperature. According to some embodiments, the relative humidity and/or the temperature in the environment of the magnetic structure may be sufficiently similar to a local relative humidity and/or local temperature in a vicinity of a tunnel junction at a given time, e.g., as measured within a housing or enclosure of the device in which the tunnel junction resides. In such embodiments, the relative humidity and/or the temperature in the environment of the magnetic structure measured using sensors as described above, may be used (e.g., for calculations, extrapolations, etc.) as the local relative humidity and/or temperature in a vicinity of the tunnel junction, and therefore are deemed equivalent. These embodiments may correspond to instances in which the relative humidity and/or the temperature have high dispersion (e.g., a low number of gradients across the environment).

However, in other embodiments the relative humidity and/or the temperature in the environment of the magnetic structure may be different than the local relative humidity and/or temperature in a vicinity of the tunnel junction. Thus, the local relative humidity and/or temperature may be independently determined. According to different approaches, the local relative humidity and/or temperature in a vicinity of the tunnel junction may be determined using localized sensors, mathematical equations, stored values, estimations, etc. via techniques known in the art.

Figure 10:
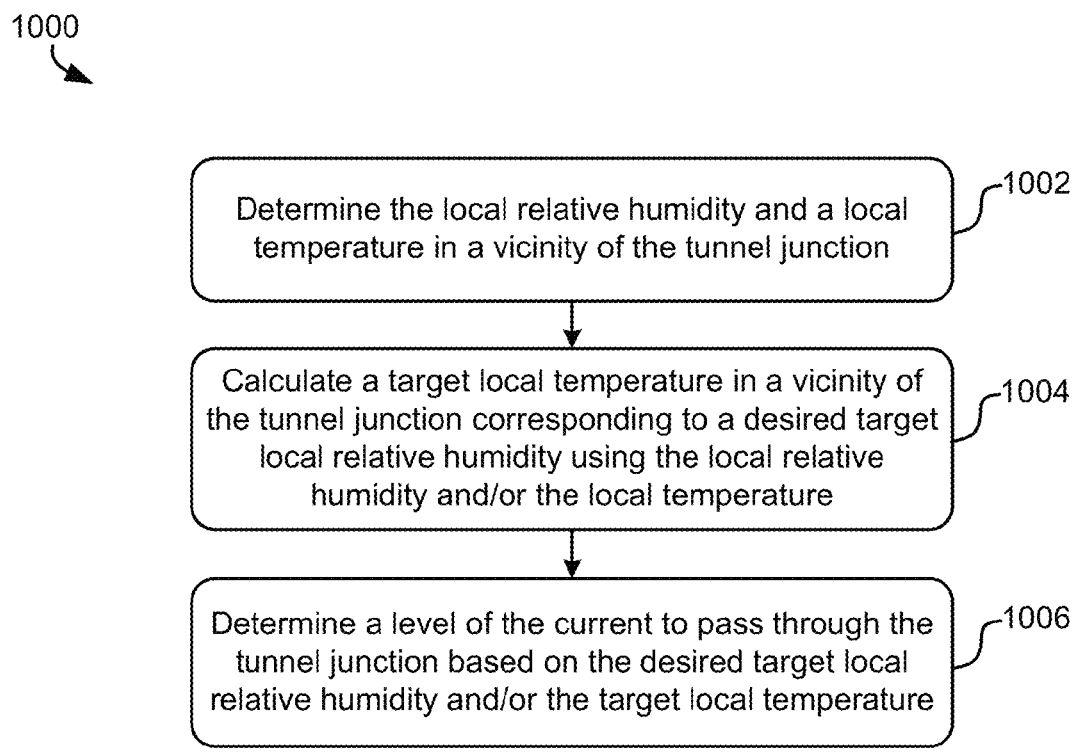
FIG. 10 is a flowchart of a method according to one embodiment.

Referring still to FIG. 10, operation 1004 includes calculating a target local temperature in a vicinity of the tunnel junction corresponding to a desired target local relative humidity using the local relative humidity and/or the local temperature. Furthermore, operation 1006 includes determining a level of the current to pass through the tunnel junction based on the desired target local relative humidity and/or the target local temperature.

According to an illustrative embodiment, which is in no way intended to limit the invention, the target local temperature corresponding to a desired target local relative humidity may be calculated using a polynomial function. Looking to FIG. 11, the graphical representation of the polynomial function in Equation 1 below is depicted.

$$y = 0.048x^2 - 1.2565x + 24.164 \qquad \text{Equation 1}$$

Figure 11:
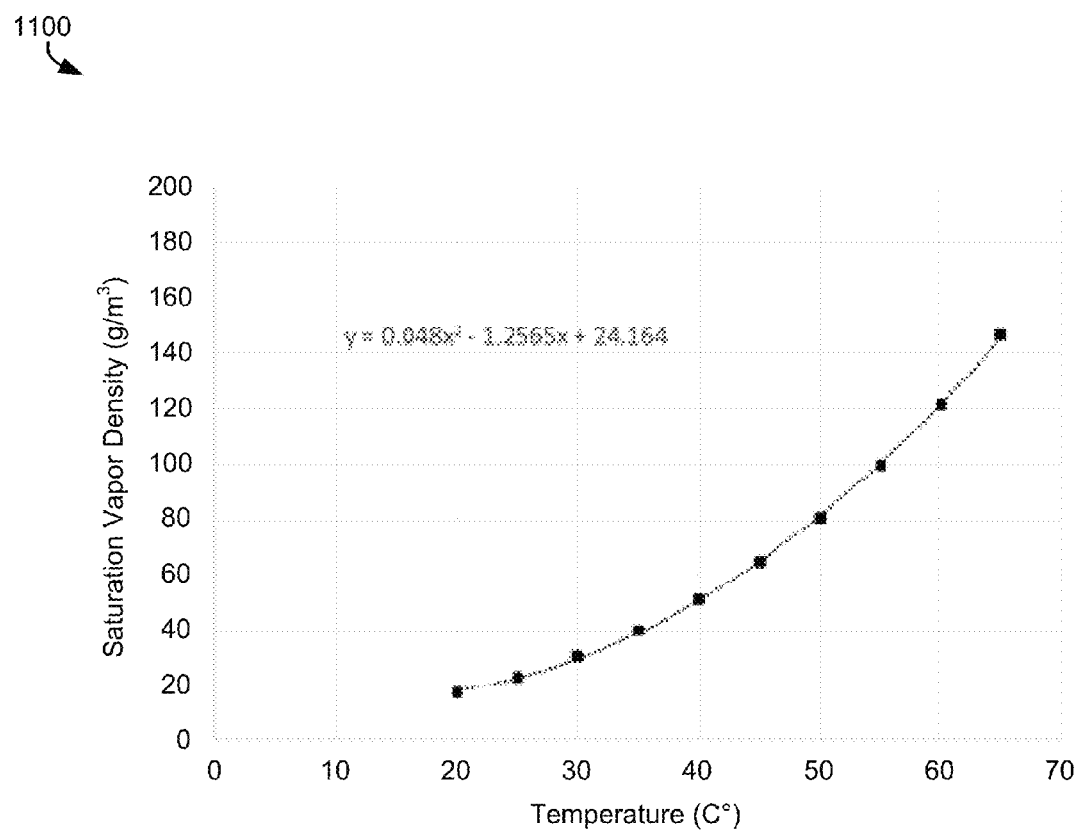
FIG. 11 is a saturation vapor density vs. temperature graph.

The graph 1100 of FIG. 11 has plotted the polynomial function in Equation 1 on a saturation vapor density vs. temperature graph which illustrates the correlation between relative humidity and temperature as used herein in accordance with an exemplary embodiment. The relationship between saturation vapor density values and corresponding temperatures may be stored in memory and accessed from a lookup table.

After the local relative humidity and/or local temperature in a vicinity of the tunnel junction have been determined (e.g., see operation 1002), the desired target local relative humidity may be used to determine the corresponding target local temperature using the polynomial function of Equation 1 and/or the curved plot of graph 1100. The difference in temperature between the current local temperature and the target local temperature represents the increase in temperature at the tunnel junction which, once implemented, will achieve the desired target local relative humidity. Moreover, the level of current passed through the tunnel junction may be adjusted according to the difference in temperature, preferably such that the current local temperature reaches the target local temperature. Once the tunnel junction reaches the target local temperature, the heat radiating out from the tunnel junction will reduce the relative humidity in a vicinity of the tunnel junction to a desired target value which will preferably reduce the amount of oxidation and/or corrosion experienced by the tunnel junction. As a result, the tunnel junction will maintain its design performance over longer periods of time, particularly those magnetic structures placed in environments having unintended and/or intentionally injected contaminants.

Experimental Data

Results achieved by implementing various embodiments described and/or suggested herein are as follows. It should be noted that the tunnel junctions corresponding to the experimental data which follows were made using MgO and had a deposition thickness on the order of 1 nm. Moreover, the sensor structures in which the tunnel junctions were formed used had a similar composition as magnetic structure 802 of FIG. 8 above. The free layer and the pinned layer were made primarily of NiFe.

As mentioned above, the inventors conducted experiments to determine the sensitivity of TMR sensors to corrosion in humid environments. Moreover, contrary to conventional wisdom, the inventors conducted experiments which tested the protection resulting from using Joule heating.

Figure 12A:
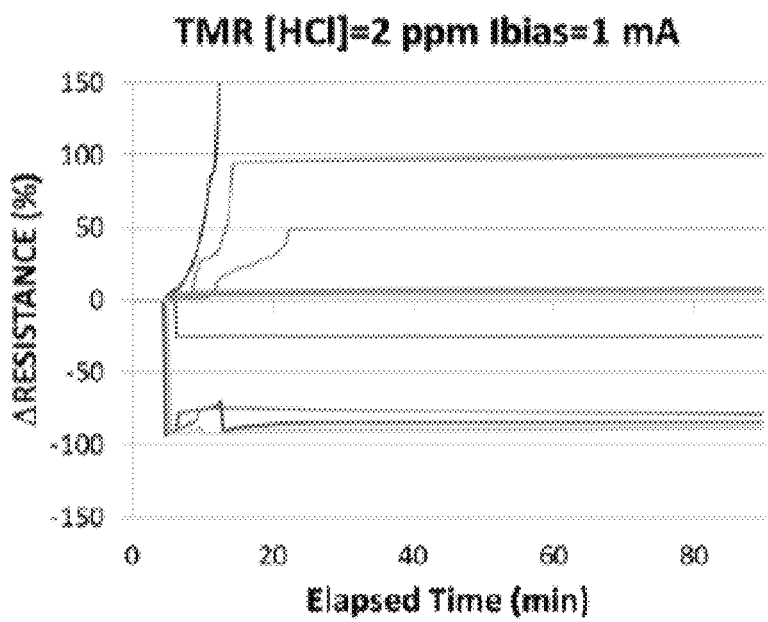
FIGS. 12A-12D are graphs showing change in resistance vs. elapsed time for varied bias currents according to different embodiments.
Figure 12B:
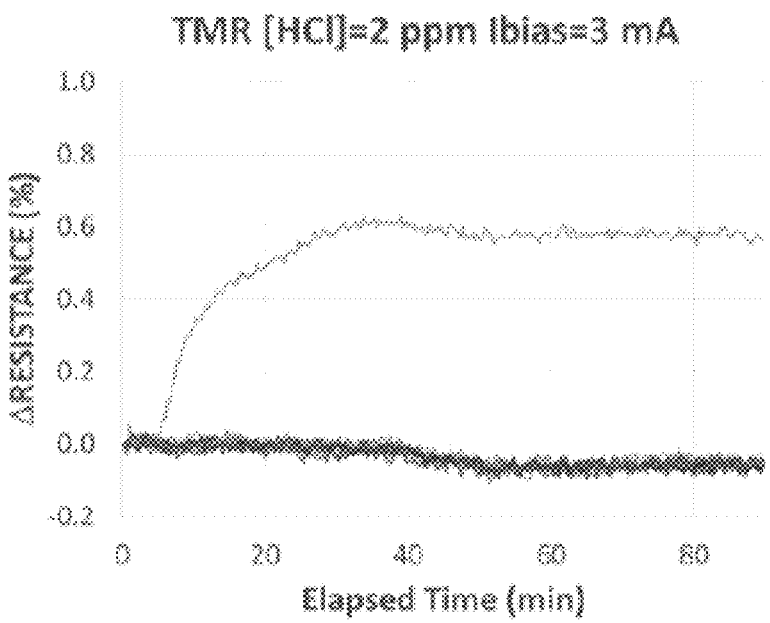

FIGS. 12A-12B illustrate plots 1200, 1210, 1220, 1230 of the change in resistance for TMR sensors with respect to time. The experiment corresponding to the results depicted in FIGS. 12A-12B was conducted for 80 minutes at an exposure of 2 parts per million (ppm) HCl gas in a chamber at 80% relative humidity and about 25° C. Moreover, currents of 1 mA, 3 mA, 4.5 mA and 6 mA were applied to each of the TMR sensors associated with FIGS. 12A-12B respectively. Each of the curves shown in plots 1200, 1210, 1220, 1230 represent a TMR sensor, each of which have a substantially similar construction.

Looking specifically to plot 1200 of FIG. 12A, all nine of the TMR sensors having a 1 mA current applied thereto were found to have corroded severely within minutes of exposure to the aforementioned conditions of 2 ppm HCl gas in a chamber at 80% relative humidity. The curves which indicate a fall in resistance are believed by the inventors to have been caused by salts from the contaminant HCl gas gathering on the TMR sensor, thereby forming a conductive layer which led to the drop in resistance. Note that the temperature rise of a TMR sensor is based on the resistance and geometry of the sensor, so that while 1 mA offered no substantial protection of the TMR sensors used in this study, for TMR sensors having a different resistance and/or geometry, 1 mA may offer excellent protection.

Figure 12C:
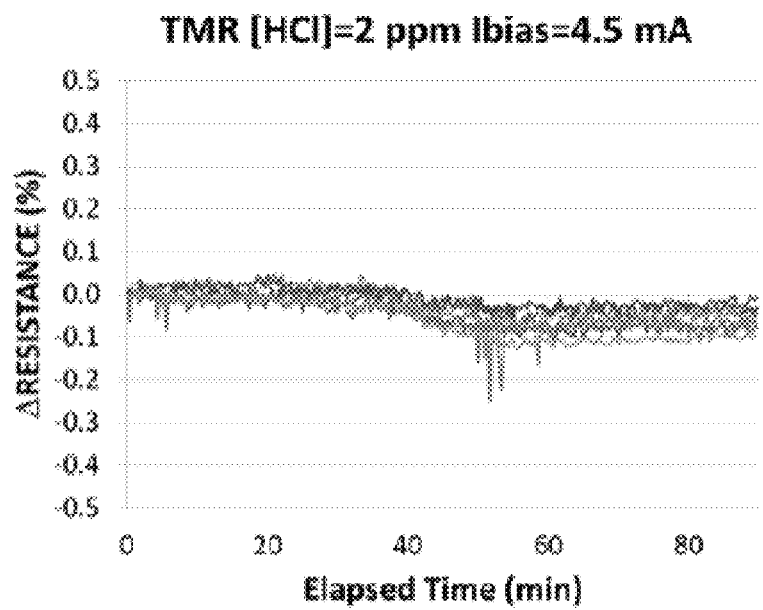
Figure 12D:
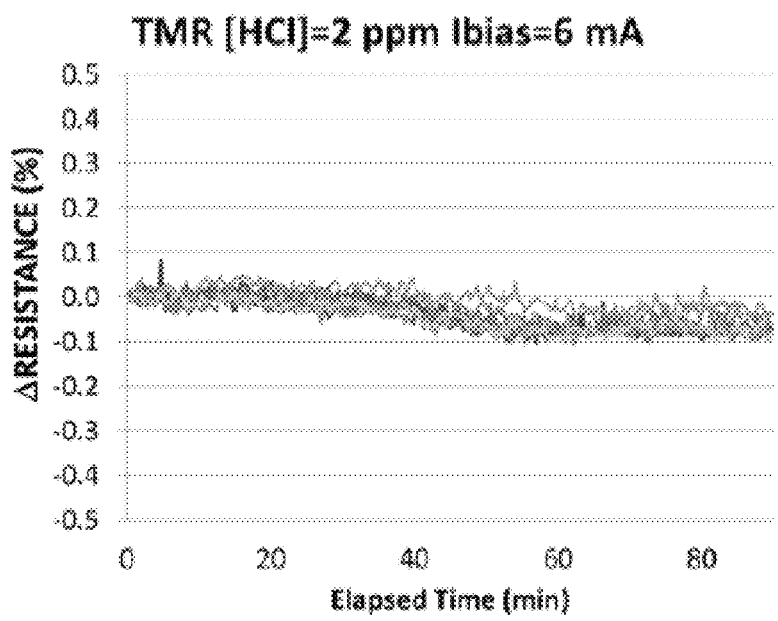

In sharp contrast, only one of nine TMR sensors in plot 1210 of FIG. 12B having a 3 mA current applied thereto corroded within 20 minutes, but only to a level of +0.5% of an original resistance of the sensor. The remaining eight sensors did not exhibit a resistance change and did not display any optically observable corrosion at the media facing side thereof. Moreover, looking to plot 1220 of FIG. 12C, none of the seven TMR sensors having a 4.5 mA current applied thereto exhibited resistance changes associated with corrosion. Neither did any of the 9 TMR sensors having a 6 mA current applied thereto as illustrated in plot 1230 of FIG. 12D. Additionally, no corrosion was visually observed on any of the metals of the TMR sensors in FIGS. 12C-12D biased with 4.5 mA and 6 mA currents respectively.

Thus, the 1 mA current did not offer any substantial corrosion protection for the TMR sensors as shown in the results shown in FIG. 12A. Moreover, while the 3 mA current offered some corrosion protection under the parameters of the experiment, longer periods of exposure would likely result in more substantial corrosion. Conversely, the 4.5 mA and 6 mA currents offered exceptional corrosion protection for the high level of contamination (HCl gas) for the entire 80 minute exposure time not only to the tunnel junctions of the sensors, but also to the surrounding layers.

The experiments revealed that the metal layers surrounding the TMR sensors were found to have been protected from corrosion when the 4 mA and 6 mA currents were applied thereto, while the same metal shields were corroded in the sensors having only the 1 mA current applied thereto. As a result, this shows that Joule heating external to the material of the tunnel junction may be achieved, as will be further described below (e.g., see FIG. 16).

Figure 13:
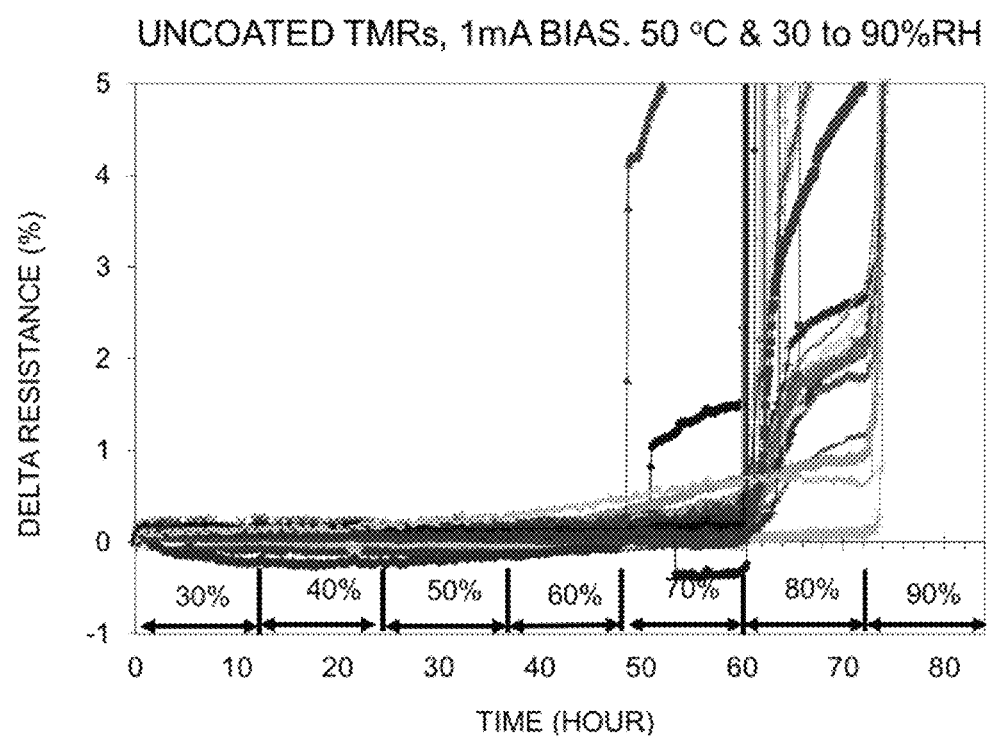
FIG. 13 is a graph of change in resistance vs. elapsed time over a range of stepped relative humidity percentages for various sensors according to one embodiment.

Graph 1300 of FIG. 13 depicts the results of another test conducted by introducing drives containing TMR sensors to a chamber having a very minimal level of corrosive gases unintentionally introduced thereto. Moreover, the chamber was kept at 50° C. and operated at varying levels of elevated relative humidity over time as described below. Graph 1300 plots the change of resistance versus time for the TMR sensors which were uncoated and had a 1 mA current passed therethrough. As shown in FIG. 13, the relative humidity in the chamber was gradually ramped from 30% to 90% relative humidity in 12 hour steps. Each of the curves shown in graph 1300 represent a TMR sensor, each of which have a substantially similar construction.

As seen in the data presented in graph 1300, below 70% relative humidity, virtually no corrosion was observed on any of the TMR sensors for the entire amount of exposure time. At 70% relative humidity, two of the TMR sensors can be seen as being corroded, a first of which corroded substantially to over 4% of an original resistance of the sensor within a few minutes, and kept corroding over time (signified by the steady increase in resistance). The second TMR sensor began corroding after about 4 hours of exposure to the 70% relative humidity, and rose to a level of 1.5% of the original resistance of the sensor by the end of the 10 hour exposure window.

When the relative humidity was raised to 80% relative humidity, about half of the TMR sensors corroded to well over 5% of an original resistance (many experiencing a 100% increase in resistance) within the first 4 hours of exposure. Essentially all of the other half of the sensors corroded to levels between 0.5% and 3% of an original resistance by the end of the exposure window. Finally, after the relative humidity was raised to 90% relative humidity, all of the TMR sensors corroded to very high resistance levels within 2 hours of exposure.

Figure 14:
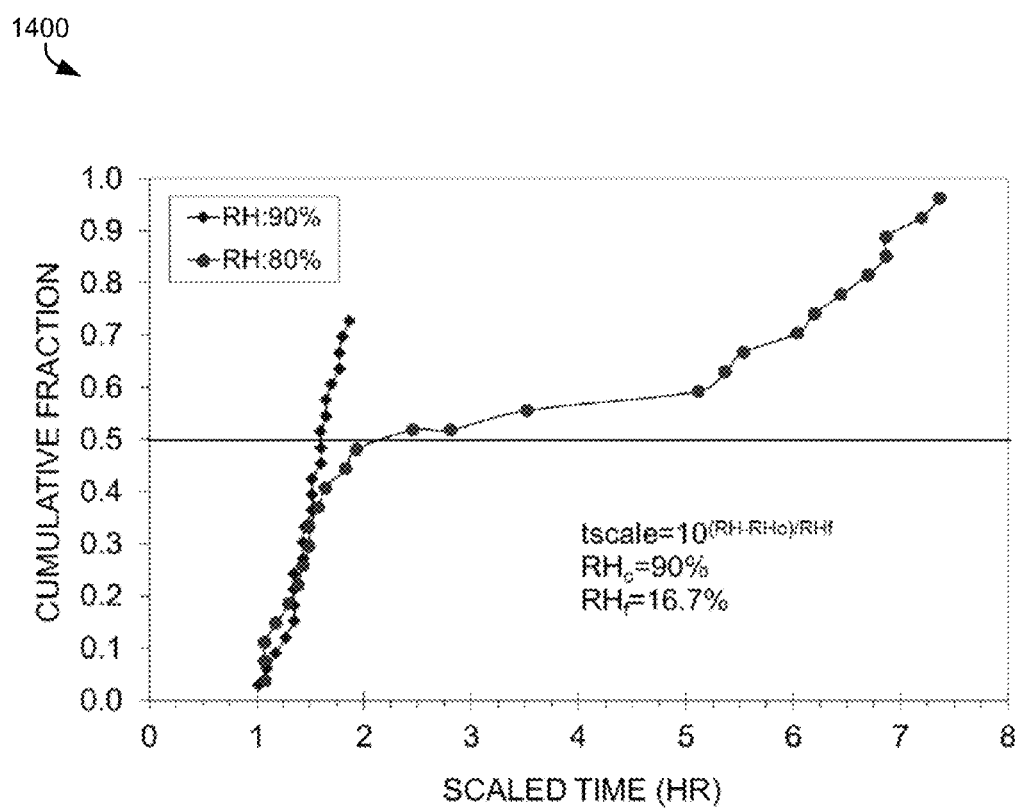
FIG. 14 is a graph of cumulative fraction of corroded elements vs. time according to the data of FIG. 13.

The results of this experiment show that by passing even a relatively low amount of current through a TMR sensor structure, corrosion may be prevented at least for low relative humidity levels despite the presence of a corrosive agent. The graph 1400 of FIG. 14 plots the cumulative fraction of corroded TMR elements versus time scaled to 90% and 80% relative humidity using the relative humidity data presented in FIG. 13. The scaled time, $t_{scale}$, is given by Equation 2 as follows:

$$t_{scale} = 10^{(RH-RH_o)/RHF}$$
Equation 2

RH represents the relative humidity while $RH_o$, represents the humidity to which the data is scaled, and is 90% according to the present experiment. Moreover, $RH_o$ represents the scaling factor of 16.7%. In other words, the time-to-failure increases by a factor of 10 for each 16.7% change in the relative humidity. Applying the foregoing Equation 2 to an example which is in no way intended to limit the invention, if the first corroded part was observed after 1 hour of exposure to an environment having 90% relative humidity, an extrapolation for the first corroded part to appear at 40% relative humidity would require an exposure time of about 1 month and an exposure time of about 1 year for an environment having 25% relative humidity. It should be noted that the limited amount of data and the brevity of the duration, the error in the parameter RHF is large. However, the trend is clear that dropping the relative humidity significantly extends the life of a material before experiencing corrosion. For example, relative humidity levels of 30% or lower greatly extend the exposure time before experiencing corrosion even in the presence of corrosive contaminants.

Figure 15:
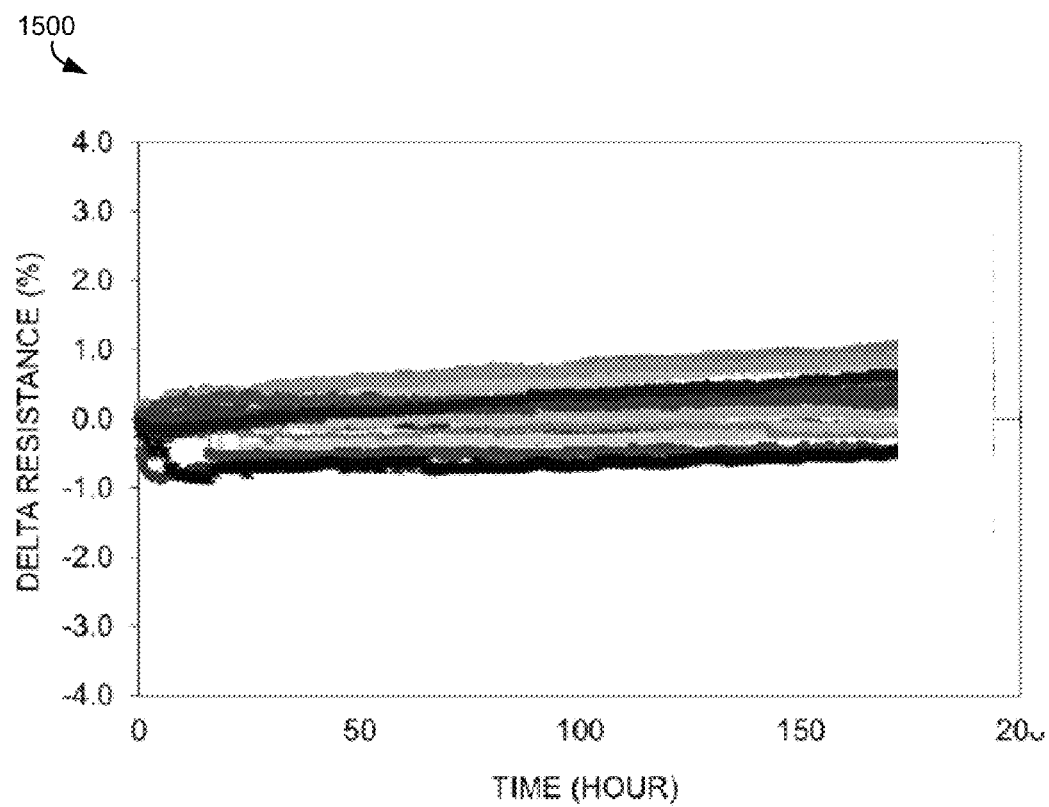
FIG. 15 is a graph of change in resistance vs. elapsed time for various sensors according to one embodiment.

Moving to FIG. 15, graph 1500 illustrates the results of applying a 6 mA current to a number of sensor structures. Applying the 6 mA current successfully reduced the relative humidity in a vicinity of the sensors' tunnel junctions, thereby creating a locally low relative humidity environment. Each of the curves shown in graph 1500 represent a TMR sensor, each of which have a substantially similar construction.

As seen in FIG. 15, the plots illustrate the changes in resistance versus time for uncoated TMR sensors in a chamber having a temperature of 50° C. and a relative humidity of 90% relative humidity. Additionally, a low level of corrosive gas was introduced to the testing chamber to test the ability of the 6 mA current applied to the sensors to protect against corrosion. The experiment was run for 8 days with no noticeable corrosion to any of the sensors despite the high relative humidity and presence of corrosive gas in the testing chamber.

Figure 16:
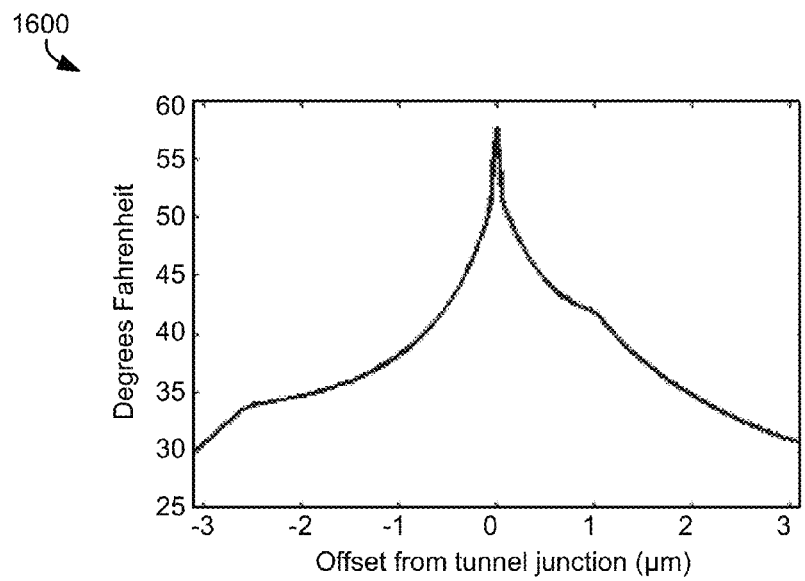
FIG. 16 is a graph of the finite element analysis (FEA) calculated thermal profile of a TMR sensor according to one embodiment.

To understand the Joule heating, FEA calculations were performed using the plausible thermal conductivity for a laminated metal surrounding an exemplary thin tunnel junction. The graph 1600 of FIG. 16 shows the calculated thermal profile of a TMR sensor having an area of 1 μm². Although the spike in temperature to about 60° C. from ambient experienced at the tunnel junction (offset of 0 μm along the x-axis) was expected, the increase in temperature experienced by the layers surrounding the tunnel junction were not expected. Graph 1600 shows the lower shield at an offset of about −2 μm along the x-axis having experienced an increase in temperature to about 35° C. from ambient. Moreover, the temperature increase experienced in the layers surrounding the tunnel junction unexpectedly resulted in a significant increase to corrosion protection therein.

The results of the FEA showed that the temperature rise of the tunnel junction ($\Delta T_{TJ}$) is proportional to the power deposited into the tunnel junction ($P_{TJ}$) as shown in Equation 3a below.

$$\Delta T_{TJ} = P_{TJ}/\kappa_{TJ}$$
Equation 3a $\kappa_{TJ}$ represents the thermal conductance of the tunnel junction and is further described by Equation 3b.

$$\kappa_{TJ} = \kappa_o + \kappa_A * A_{TJ}$$
Equation 3b $\kappa_o$ and $\kappa_A$ are a constants related to the thermal conductivity of the metals surrounding the tunnel junction, and $A_{TJ}$ is the area of the tunnel junction. Though at zero area, $\kappa_{TJ}$ goes to zero, Equation 3b holds over a wide range of area of at least a factor of 10. However, for areas much less than about 0.1 μm², new coefficients are implemented. The FEA conducted in relation to FIG. 16 above yielded a value for $\kappa_o$ of 14 mW/° C. and for $\kappa_A$ of 42 mW/° C./μm² as would be appreciated by one skilled in the art upon reading the present description.

The thermal profile shows that the metals surrounding the tunnel junction are also heated through thermal conduction from heat source of the thin tunnel junction to the surrounding metals. Thus, heating of the tunnel junction also decrease the probability that the surrounding metals will corrode. Table 1 gives the relevant values of TMR sensors substantially similar to those implemented in the experiments corresponding to FIGS. 13-15 for determining the temperature rise, and the calculated temperature rise using FEA. As shown, at 6 mA, the heating is calculated to be 34° C., and 1° C. at 1 mA, thereby supporting the notion that the heating resulting from the application of increased levels of current result in improved protection for the magnetic structures.

TABLE 1

| $<R_{TJo}>$ (ohm Ω) | $<P_{TJ}>$ (mW) | $<Area>$ (um2) | $<\Delta T_{TJ}(1\ mA)>$ (° C.) | $<\Delta T_{TJ}(3\ mA)>$ (° C.) | $<\Delta T_{TJ}(4.5\ mA)>$ (° C.) | $<\Delta T_{TJ}(6\ mA)>$ (° C.) |
|---|---|---|---|---|---|---|
| 35.2 | 1.28 | 0.58 | 0.9 | 8.5 | 19.2 | 34.1 |

Table 2 shows the Joule heating temperature required to reduce the local relative humidity of the tunnel junction to 30% relative humidity, e.g., to protect the tunnel junction from corrosion. Note that the ambient temperature and relative humidity are $T_{air}$ and $RH_{air}$ respectively.

TABLE 2

| $RH_{air}$ | $T_{air}$ (° C.) | 20 | 25 | 30 | 35 | 40 | 50 |
|---|---|---|---|---|---|---|---|
| 40% | $\Delta T_{TJ}$ (° C.) | 5.1 | 5.3 | 5.5 | 5.6 | 5.8 | 6.0 |
| 50% | $\Delta T_{TJ}$ (° C.) | 9.1 | 9.4 | 9.7 | 10.0 | 10.3 | 10.6 |
| 60% | $\Delta T_{TJ}$ (° C.) | 12.3 | 12.7 | 13.1 | 13.4 | 14.0 | 14.5 |

TABLE 2-continued

| $RH_{air}$ | $T_{air}$ (° C.) | 20 | 25 | 30 | 35 | 40 | 50 |
|---|---|---|---|---|---|---|---|
| 70% | $\Delta T_{TJ}$ (° C.) | 15.0 | 15.5 | 16.0 | 16.6 | 17.1 | 17.6 |
| 80% | $\Delta T_{TJ}$ (° C.) | 17.4 | 18.0 | 18.6 | 19.2 | 19.8 | 20.4 |
| 90% | $\Delta T_{TJ}$ (° C.) | 19.5 | 20.1 | 20.8 | 21.5 | 22.2 | 22.9 |

Looking back to the data produced by the experiments corresponding to the graphs in FIGS. 13-15, the rate at which the first parts corroded increases by a factor of 10 for each drop of 16.7% relative humidity. Moreover, at 90% relative humidity, although the first part corroded at 1 hour despite a 1 mA current being applied thereto, not a single one of the sensors having a current level of 6 mA were corroded after an exposure time of 200 hours. It follows that the drop in the local relative humidity resulting from the 6 mA current must have been more than 38%, in view of the fact that no part of the sensors showed any sign of degrading despite the long exposure time and high relative humidity. Moreover, applying the data presented in Table 1 and Table 2, the inventors determined that a tunnel junction would likely have been protected to a desirable extent by a bias current of 4.5 mA despite being exposed to 90% relative humidity for a prolonged period of time.

The amount of heat associated with achieving such protection may be set more precisely if the relative humidity is known. Equation 4 below shows a quadratic expression used to fit the saturation vapor density ($V_{sat}$) versus temperature $T_c$ in Centigrade.

$$V_{sat}(T_c) = 24.164 - 1.257 T_c + 0.48 T_c^2 \quad \text{Equation 4}$$

The relative humidity (RH) may then be represented by the actual vapor density ($V_{moisture}$) divide by the saturation vapor density ($V_{sat}$) as shown in Equation 5.

$$RH = V_{moisture}/V_{sat} \quad \text{Equation 5}$$

It follows that, if the environmental temperature ($T_{env}$) is known, Equation 4 yields to environmental saturation density such that $V_{sat\text{-}env} = V_{sat}(T_{env})$. Conversely, if the environmental relative humidity ($RH_{env}$) yields the moisture level, Equation 6 may be utilized.

$$V_{moisture} = RH_{env} * V_{sat}(T_{env}) \quad \text{Equation 6}$$

Finally, if the local temperature (e.g., in a vicinity of a tunnel junction) is increased by $\Delta T_{TJ}$ above $T_{env}$ through Joule heating (e.g., resulting from passing an increased current level through the tunnel junction), then the local relative humidity ($RH_{loc}$) may be determined using Equation 7:

$$RH_{env} = V_{moisture}/V_{sat}(T_{env} + \Delta T_{TJ}) = RH_{env} * V_{sat}(T_{env})/V_{sat}(T_{env} + \Delta T_{TJ}) \quad \text{Equation 7}$$

It follows that the rate of corrosion is significantly slowed the lower the local relative humidity. The inventors discovered that maintaining the local relative humidity at about 70% is shown to greatly reduce the chance of corrosion time compared to the corrosion time at 80% local relative humidity. Moreover, dropping the local relative humidity to 60% reduces the corrosion rate even further.

Accordingly, in one embodiment, the environmental temperature, $T_{env}$, and relative humidity, $RH_{env}$, are measured and the local relative humidity, $RH_{local}$, versus local temperature, $T_{local}$, are calculated using a polynomial function from known values of saturation vapor density. The Joule heating temperature rise, $DT_{TJ}$, required to achieve a particular $RH_{local}$ is determined from the polynomial. The Joule heating temperature rise versus power into the tunnel junction are used to determine the necessary current through and voltage across the tunnel junction to achieve the particular $RH_{local}$.

As mentioned above, reliability against dielectric breakdown is another area of interest for various embodiments described herein. It is well known that tunnel junctions may be damaged by dielectric breakdown if too high a voltage is applied across the tunnel junctions for too long a period of time. The dielectric breakdown of the devices may be measured as a function of voltage and time, from which a safe operating voltage to be applied across the tunnel junction for the life time of the product may be extrapolated. Once the highest voltage ($V_{upper}$) which may be applied across the device without causing dielectric breakdown has been determined, the corresponding maximum current level can be determined, e.g., using Ohm's law. Accordingly, the maximum current level ($I_{upper}$) which may be applied to the tunnel junction without causing damage thereto is determined.

In choosing a current level for protecting the tunnel junction, it is preferred that the current level is above a minimum limit to ensure protection, and below an upper limit $I_{upper}$ such that the maximum reliable voltage $V_{upper}$ is not exceeded. The minimum limit for the current level may be determined using any one or more of the processes described above, e.g., based on a current local relative humidity and/or a target local relative humidity. In preferred approaches, the level of the current applied to the tunnel junction may be equal to or greater than a normal operation current level used when the magnetic structure is operating for its intended use. However, the level of current and/or the amount of heat required to reduce the local relative humidity by a desired amount may vary depending on the embodiment. One method which may be used to determine $V_{upper}$ includes applying constant voltages for an extended time period and determining the dielectric breakdown time at the given voltage. One approach of fitting the dielectric breakdown time ($t_{DB}$) versus the tunnel junction voltage ($V_{TJ}$) is shown in Equation 8:

$$t_{DB} = t_{DBo} * \exp(V_{DBo}/V_{TJ}) \quad \text{Equation 8}$$

$t_{DBo}$ and $V_{DBo}$ are fitting parameters with units of time and voltage respectively. $V_{upper}$ may then be determined by inverting Equation 8 and using the desired life time of the product, $t_{DB\text{-}Life}$ as shown in Equation 9.

$$V_{upper} = V_{DBo}/\ln(t_{DB\text{-}Life}/t_{DBo}) \quad \text{Equation 9}$$

For a fixed voltage, tunnel junctions usually do not have a fixed breakdown time, but rather a distribution which may be represented by a survival probability S(t) for a given time t.

$$S(t) = \exp(-(t/t_{DB})^\beta) \quad \text{Equation 10}$$

Equation 10 is preferably taken into account when determining the desired life time of the product $t_{DB\text{-}Life}$ to use in Equation 8. Furthermore, the parameter $t_{DBo}$ depends on the surface area of the tunnel junction exposed to the current as the current passes through the sensor stack. Thus, it is desirable that the reliability is measured by at least incorporating the tunnel junction area.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
   a magnetic structure having a tunnel junction; and
   a controller and logic integrated with and/or executable by the controller, the logic being configured to:
      reduce a local relative humidity in a vicinity of the tunnel junction by passing a current through the tunnel junction for at least a period of time that the tunnel junction would otherwise not have a current passing therethrough.

2. A system as recited in claim 1, the logic being configured to:
   determine a relative humidity in an environment of the magnetic structure,
   wherein the current is passed through the tunnel junction in response to determining that the relative humidity in the environment of the magnetic structure is above a threshold.

3. A system as recited in claim 1, the logic being configured to:
   determine a relative humidity in an environment of the magnetic structure,
   wherein the current is not passed through the tunnel junction in response to determining that the relative humidity in the environment of the magnetic structure is below a threshold.

4. A system as recited in claim 1, wherein a level of the current is equal to or greater than a normal operation current level.

5. A system as recited in claim 1, wherein the current is passed through the tunnel junction when the tunnel junction is not in normal use.

6. A system as recited in claim 1, the logic being configured to:
   determine the local relative humidity and a local temperature in a vicinity of the tunnel junction;
   calculate a target local temperature in a vicinity of the tunnel junction corresponding to a desired target local relative humidity using the local relative humidity and/or the local temperature; and
   determine a level of the current to pass through the tunnel junction based on the desired target local relative humidity and/or the target local temperature.

7. A system as recited in claim 1, wherein the magnetic structure is a tunnel magnetoresistance read sensor.

8. A system as recited in claim 1, comprising logic configured to:
   measure both an environmental temperature and a relative humidity;
   calculate the local relative humidity versus local temperature using a polynomial function from known values of saturation vapor density;
   calculate a Joule heating temperature rise required to achieve a particular local relative humidity from the polynomial; and
   use the Joule heating temperature rise versus power into the tunnel junction to determine the necessary current through and voltage across the tunnel junction to achieve the particular local relative humidity.

9. A system as recited in claim 1, wherein the magnetic structure is a magnetic memory element.

10. A method, comprising:
    determining a relative humidity in an environment of a tunnel junction that is part of a magnetic structure; and
    selecting an operating current from a range of allowable operating currents based on the determined relative humidity;
    wherein the selected level of the current is high enough to heat the tunnel junction to a temperature which reduces a local relative humidity in a vicinity of the tunnel junction.

11. A method as recited in claim 10, wherein the magnetic structure is a tunnel magnetoresistance read sensor.

12. A method as recited in claim 11, wherein the range of allowable operating currents is limited to operating currents at which the tunnel magnetoresistance read sensor can read data from a magnetic medium.

13. A method as recited in claim 12, wherein the magnetic medium is a magnetic recording tape.

14. A method as recited in claim 10, comprising passing a current through the tunnel junction for at least a period of time that the tunnel junction would otherwise not have a current passing therethrough.

15. A method as recited in claim 14, wherein a level of the current passed through the tunnel junction during the period of time that the tunnel junction would otherwise not have an operating current passing therethrough is higher than the highest allowable operating current.

16. A method as recited in claim 10, comprising:
    determining a temperature in an environment of the magnetic structure;
    using the determined relative humidity and the temperature in the environment of the magnetic structure to calculate the local relative humidity and a local temperature in a vicinity of the tunnel junction; and
    using the local relative humidity and/or the local temperature in the vicinity of the tunnel junction to determine the level of the current to pass through the tunnel junction.

17. A method as recited in claim 10, wherein the magnetic structure is a magnetic memory element.

* * * * *